(12) United States Patent
Ghasemi-Nejhad et al.

(10) Patent No.: US 12,060,271 B2
(45) Date of Patent: Aug. 13, 2024

(54) CONTINUOUS PRODUCTION OF NANOFORESTS

(71) Applicants: University of Hawai'i, Honolulu, HI (US); Goodman Technologies LLC, Albuquerque, NM (US)

(72) Inventors: Mohammad Naghi Ghasemi-Nejhad, Honolulu, HI (US); Vamshi M. Gudapati, Painted Post, NY (US); Pouria Taeb, Kapolei, HI (US); Brenden M. Minei, Honolulu, HI (US); William A. Goodman, Albuquerque, NM (US)

(73) Assignees: University of Hawai'i, Honolulu, HI (US); Goodman Technologies LLC, Albuquerque, NM (US)

( * ) Notice: Subject to any disclaimer, the term of this patent is extended or adjusted under 35 U.S.C. 154(b) by 0 days.

(21) Appl. No.: 18/015,295

(22) PCT Filed: Jul. 9, 2021

(86) PCT No.: PCT/US2021/041188
§ 371 (c)(1),
(2) Date: Jan. 9, 2023

(87) PCT Pub. No.: WO2022/011320
PCT Pub. Date: Jan. 13, 2022

(65) Prior Publication Data
US 2023/0264960 A1  Aug. 24, 2023

Related U.S. Application Data

(60) Provisional application No. 63/049,885, filed on Jul. 9, 2020.

(51) Int. Cl.
C01B 32/164 (2017.01)
C23C 16/26 (2006.01)
(Continued)

(52) U.S. Cl.
CPC ............ C01B 32/164 (2017.08); C23C 16/26 (2013.01); C23C 16/45565 (2013.01);
(Continued)

(58) Field of Classification Search
CPC ... C01B 32/154; C01B 32/156; C01B 32/164; C01B 32/168; C23C 16/24; C23C 16/26; C23C 16/408; C23C 16/407; C23C 16/56
See application file for complete search history.

(56) References Cited

U.S. PATENT DOCUMENTS

| 3,878,872 A | 4/1975 | Hintsch |
| 4,561,802 A | 12/1985 | Campo |

(Continued)

FOREIGN PATENT DOCUMENTS

| WO | 2008060294 A2 | 5/2008 |
| WO | 2011106109 A2 | 9/2011 |
| WO | 2021216160 A2 | 10/2021 |

OTHER PUBLICATIONS

Ando, Y., et al., "Production of Ultrafine Powder of [Beta]-Sic by Arc Discharge", Journal of Crystal Growth, vol. 60, 1982, 147-149.
(Continued)

Primary Examiner — Michael P Wieczorek
(74) Attorney, Agent, or Firm — Philip D. Askenazy; Peacock Law P.C.

(57) ABSTRACT

Methods and apparatuses for continuous, large scale, commercially viable production of nanoforests. A roll-to-roll process passes a flexible substrate, including fibers and fabrics, through a furnace. Precursors are introduced in a growth zone in which a vertical or horizontal nanoforest of nanotubes or nanowires is grown on the substrate. Sensors and actuators with feedback control are provided for parameters such as substrate speed, substrate tension, furnace temperature, precursor flow rate, nanoforest thickness, and
(Continued)

nanoforest. The furnace is preferably enclosed for environmental and safety purposes. The feed roll and take-up roll are disposed in housings can be attached to the furnace via airlocks, which enables rapid loading and unloading of the rolls using techniques well known in the industry while maintaining furnace conditions. The furnace can encompass flattening rollers and a second growth zone to enable manufacture of orthogonal nanoforests comprising a vertical nanoforest grown on a horizontal nanoforest.

19 Claims, 21 Drawing Sheets

(51) Int. Cl.
*C23C 16/455* (2006.01)
*C23C 16/54* (2006.01)
*C23C 16/56* (2006.01)
*F27B 9/24* (2006.01)

(52) U.S. Cl.
CPC ............ *C23C 16/545* (2013.01); *C23C 16/56* (2013.01); *F27B 9/243* (2013.01); *C01B 2202/08* (2013.01); *F27B 2009/2446* (2013.01)

(56) References Cited

U.S. PATENT DOCUMENTS

| | | |
|---|---|---|
| 7,658,870 B2 | 2/2010 | Nejhad et al. |
| 7,875,212 B2 | 1/2011 | Nejhad et al. |
| 8,148,276 B2 | 4/2012 | Nejhad et al. |
| 8,349,404 B2 | 1/2013 | Resasco et al. |
| 9,120,908 B2 | 9/2015 | Russ et al. |
| 10,894,718 B2 | 1/2021 | Huynh |
| 11,084,724 B2 | 8/2021 | Huynh |
| 2008/0018012 A1 | 1/2008 | Lemaire et al. |
| 2008/0159944 A1 | 7/2008 | Park |
| 2008/0170982 A1 | 7/2008 | Zhang et al. |
| 2010/0272891 A1 | 10/2010 | Malecki et al. |
| 2012/0273118 A1 | 11/2012 | Jiang et al. |
| 2013/0216811 A1 | 8/2013 | Ghasemi-Nehjad et al. |
| 2018/0305212 A1 | 10/2018 | Huynh |
| 2019/0177167 A1 | 6/2019 | Huynh |
| 2021/0139332 A1* | 5/2021 | Garg ..................... C01B 32/186 |
| 2021/0340012 A1 | 11/2021 | Huynh |

OTHER PUBLICATIONS

Askari, D. , "Analytical, Numerical, and Experimental Investigations on Effective Mechanical Properties and Performances of Carbon Nanotubes and Nanotube Based Nanocomposites with Novel Three Dimensional Nanostructures", PhD Dissertation, Department of Mechanical Engineering, University of Hawaii at Manoa, 2009.
Calvert, P. , "Nanotube composites: a recipe for strength", Nature, vol. 399, 1999, 210-211.
Dexter, H. B., et al., "Impact resistance and interlaminar fracture toughness of through-the-thickness reinforced graphite/epoxy", 27th AIAA Structural Dynamics and Materials Conference, AIAA Paper 86-1020, 1986, 700-709.
Endo, M. , et al., "The Production and Structure of Pyrolytic Carbon Nanotubes (PCNTs)", Journal of Physics and Chemistry of Solids, vol. 54, 1993, 1841-1848.
Ghasemi Nejhad, M N., "Hierarchical Multifunctional Nanocomposites", Behavior and Mechanics of Multifunctional Materials and Composites VIII (SSN04), Nakhiah C. Goulbourne and Hani E. Naguib, Eds., Proc. of SPIE's 21st International Conference on Smart Structures/NDE, Conference 9058, vol. SS14-SSN04-27, Paper SSN04-9058-7, 2014, 905807-1-16.
Ghasemi Nejhad, M. N., "Multifunctional Hierarchical Nanocomposite Laminates for Automotive/Aerospace Applications", Multi-Functionality of Polymer Composites: Challenges and New Solutions—Applications in Transportation, K. Friedrich and U. Breuer, Eds., Elsevier Publications, Waltham, MA, USA, 2015, 491-526.
Huang, H. , et al., "Aligned carbon nanotube composite films for thermal management", Advanced Materials, vol. 17, 2005, 1652-1656.
Iijima, S. , "Helical Microtubules of Graphitic Carbon", Nature, vol. 354, 1991, 56-58.
Khosroshahi, K. , et al., "Processing and characterization of nanopartices and carbon nanotube reinforced continuous fiber ceramic nanocomposites by preceramic polymer pyrolysis", SPIE Conference on Optomechanics and Optical Manufacturing; Material Technologies and Applications to Optics, Structures, Components, and Sub-Systems IV (Conference OP304), San Diego, CA., Ref. No. OP304-18, Paper 11101-4, 2019, 1-13.
Koratkar, N. , et al., "Carbon Nanotube films for damping applications", Advanced Materials, vol. 14, 2002, 997-1000.
Mouritz, S. P., "Fracture and tensile fatigue properties of stitched fiberglass composites", Journal of Materials: Design and Applications, vol. 218, 2004, 87-93.
Nuismer, R. J., et al., "Uniaxial Fracture of Composite Laminates Containing Stress Concentrations", Fracture Mechanics of Composites, ASTM STP 593, American Society of Testing and Materials, 1975, 117.
Park, Y. T., et al., "Epoxy Toughening with Low Graphene Loading", Advanced Functional Materials, vol. 25, No. 4, Jan. 28, 2015, 575-585.
Takagi, D. , et al., "Single-Walled Carbon Nanotube Growth from Highly Activated Metal Nanoparticles", Nano Letters, vol. 6, 2006, 2642-2645.
Thostenson, E. T., et al., "Nanocomposites in Context", Composites Sci. and Tech, vol. 65, 2005, 491-516.
Zhou, W. , et al., "Copper Catalyzing Growth of Single-Walled Carbon Nanotubes on Substrates", Nano Letters, vol. 6, 2006, 2987-2990.
Askari, Davood , et al., "Effects of vertically aligned carbon nanotubes on shear performance of laminated nanocomposite bonded joints", Sc. Techno. Adv. Mater., vol. 13, 2012.
"Nano Adaptive Hybrid Fabric (NAHF-X)", www.udri.udayton.edu, 2015.
Ando, Y. , et al., "Growing Carbon Nanotubes", Materials Today, vol. 7, 2004, 22-29.
Ando, Y. , et al., "Preparation of Carbon Nanotubes by Arc-discharge Evaporation", Japanese Journal of Applied Physics, vol. 32, 1993, L107-L109.
Andrews, R. , et al., "Continuous Production of Aligned Carbon Nanotubes: a Step Closer to Commercial Realization", Chemical Physics Letters, vol. 303, 1999, 467-474.
Beiruck, M. J., et al., "Carbon nanotube composites for thermal management", Applied Physics Letters, vol. 15, 2002, 2767-2769.
Cao, A. , et al., "Multifunctional Brushes Made from Carbon Nanotubes", Nature Materials, vol. 4, 2005, 540-545.
Cao, A. , et al., "Super-compressible foam-like films of carbon nanotubes", Science, vol. 310, 2005, 1307-1310.
Cheng, H. M., et al., "Bulk Morphology and Diameter Distribution of Single-walled Carbon Nanotubes Synthesized by Catalytic Decomposition of Hydrocarbons", Chemical Physics Letters, vol. 289, 1998, 602-610.
Dai, H. , et al., "Single-wall Nanotubes Produced by Metal-catalyzied Disproportionation of Carbon Monoxide", Chemical Physics Letter, vol. 260, 1996, 471-475.
Dee, Nicholas T., et al., "In situ mechanochemical modulation of carbon nanotube forest growth", Chemistry of Materials 31.2, Dec. 15, 2018, 407-418.
Dow, M. B., et al., "Development of stitched, braided and woven composite structures in the ACT program and at Langley Research Center", NASA Technical Report, NASA/TP-97-206234, http://techreports.larc.nasa.gov/ltrs/PDF/1997/tp/NASA-97-tp206234.pdf, 1997.

(56) References Cited

OTHER PUBLICATIONS

Flauhaut, E., et al., "Synthesis of Single-walled Carbon Nanotubes Using Binary (Fe, Co, Ni) Alloy Nanoparticles Prepared In-situ by the Reduction of Oxide Solid Solutions", Chemical Physics Letters, vol. 300, 1999, 236-242.

Hafner, J. H., et al., "Catalytic Growth of Single-wall Carbon Nanotubes from Metal Particles", Chemical Physics Letters, vol. 296, 1998, 195-202.

Hata, K., et al., "Water-Assisted Highly Efficient Synthesis of Impurity-Free Single-Walled Carbon Nanotubes", Science, vol. 306, 2004, 1362-1364.

Hernadi, K., et al., "Large Scale Synthesis of Carbon Nanotubes", Carbon, vol. 34, No. 10, 1996, 1249-1261.

Jose-Yacaman, M., et al., "Catalytic Growth of Carbon Microtubules with Fullerene Structure", Applied Physics Letters, vol. 62, 1993, 657-659.

Kashani, H., et al., "Unprecedented Electromagnetic Interference Shielding from Three-Dimensional Bi-continuous Graphene", Matter, vol. 1, 2019, 1077-1087.

Kong, J., et al., "Chemical Vapor Deposition of Methane for Single-walled Carbon Nanotubes", Chemical Physical Letters, vol. 292, 1998, 567-574.

Liu, Q., "Recent developments in the Flame-Retardant System of Epoxy Resin", Materials, vol. 13, 2020, 1-39.

Pipes, R. B., et al., "Notched Strength of Composites Materials", Journal of Composite Materials, vol. 13, 1979, 148-160.

Saini, P., et al., "Enhanced microwave absorption behavior of polyaniline-CNT/polystyrene blend in 12.4-18.0 GHz range", Synthetic Metals, vol. 161, 2011, 1522-1526.

Satishkumar, B. C., et al., "Bundles of Aligned Carbon Nanotubes Obtained by the Pyrolysis of Ferrocene-Hydrocarbon Mixtures: Role of the Metal Nanoparticles Produced In-situ", Chemical Physics Letters, vol. 307, 1999, 158-162.

Satishkumar, B. C., et al., "Single-walled Nanotubes by the Pyrolysis of Acetylene-organometallic Mixtures", Chemical Physics Letters, vol. 293, 1998, 47-52.

Schadler, L. S., et al., "Load transfer in carbon nanotube epoxy composites", Applied Physics Letter, vol. 73, No. 26, 1998, 3842-3844.

Suhr, J., et al., "Viscoelasticity in carbon nanotube composites", Nature Materials, vol. 4, 2005, 134-137.

Tai, N. H., et al., "Enhancement of the Mechanical Properties of Carbon Nanotube/Phenolic Composites Using a Carbon Nanotube Network as the Reinforcement", Carbon., vol. 42, 2004, 774-777.

Veedu, V. P., et al., "Multifunctional composites using reinforced laminae with carbon-nanotube forests", Nature Materials, vol. 5, 2006, 457-462.

Whitney, J. M., et al., "Stress Fracture Criteria for Laminated Composites Containing Stress Concentrations", Journal of Composite Materials, vol. 8, 1974, 253-265.

* cited by examiner

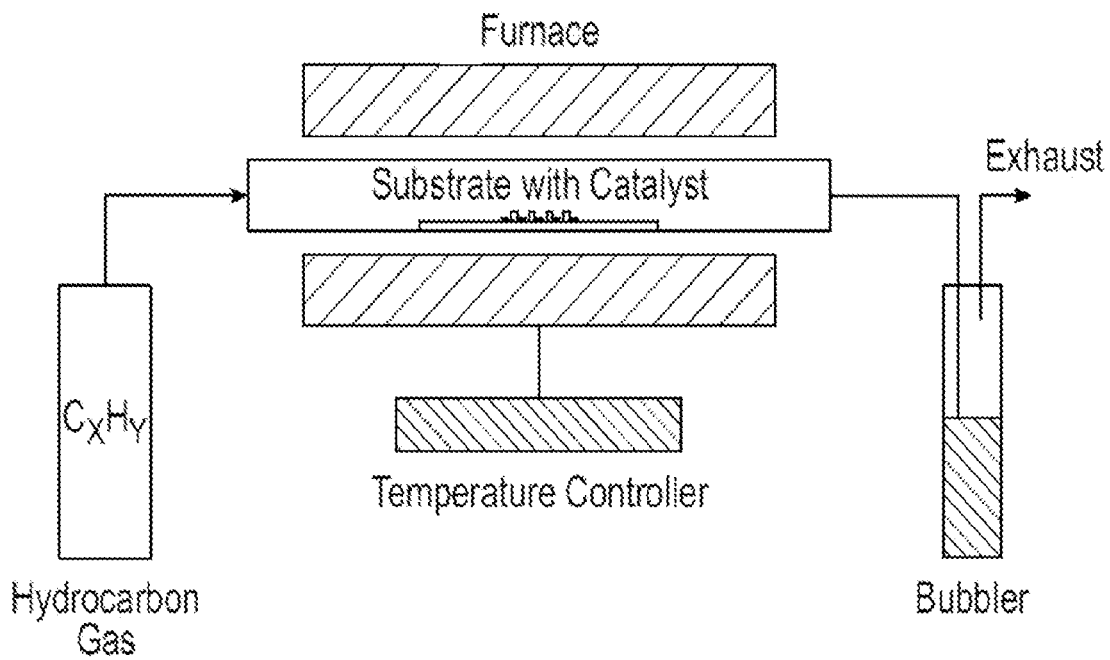
FIG. 1
(Prior Art)
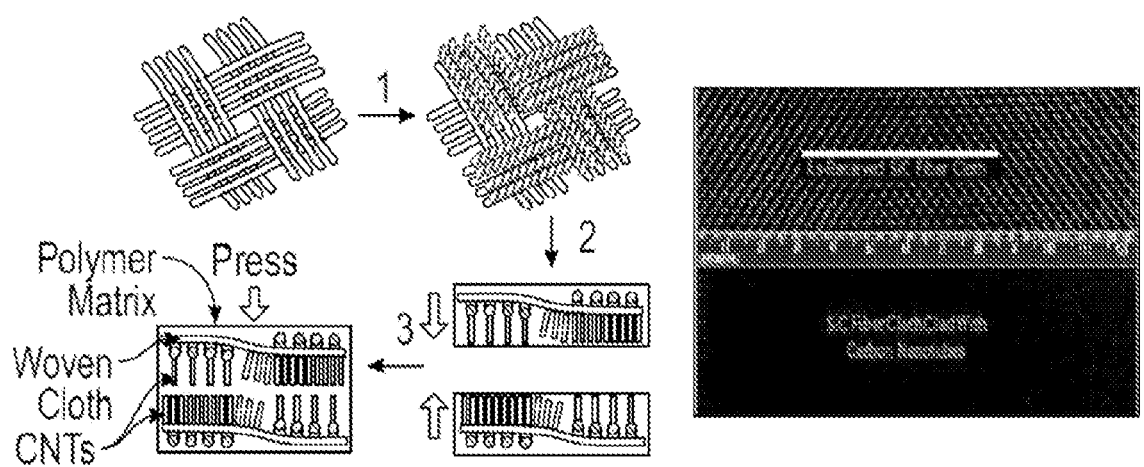
FIG. 2A
(prior art)
FIG. 2B
(prior art)

FIG. 12A  FIG. 12B
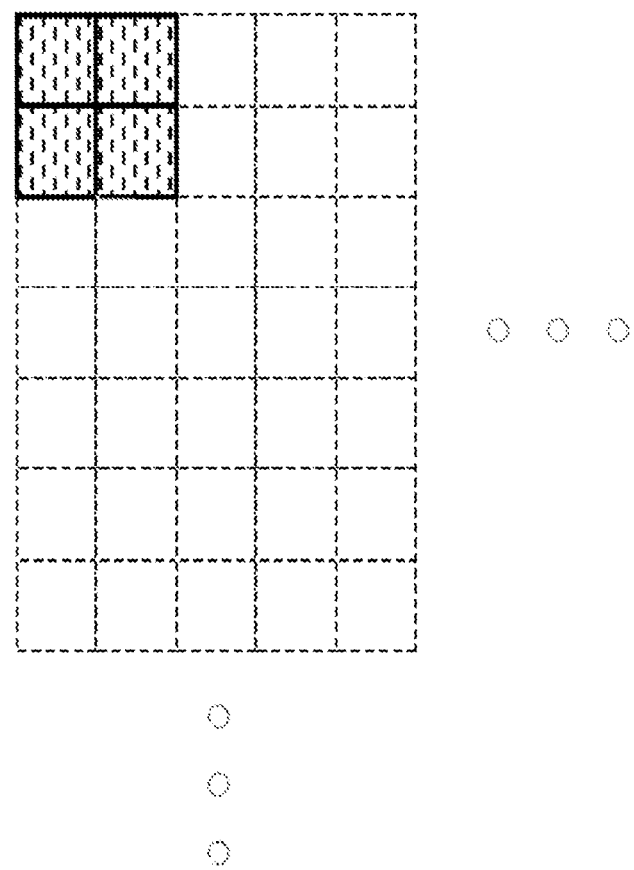
FIG. 13

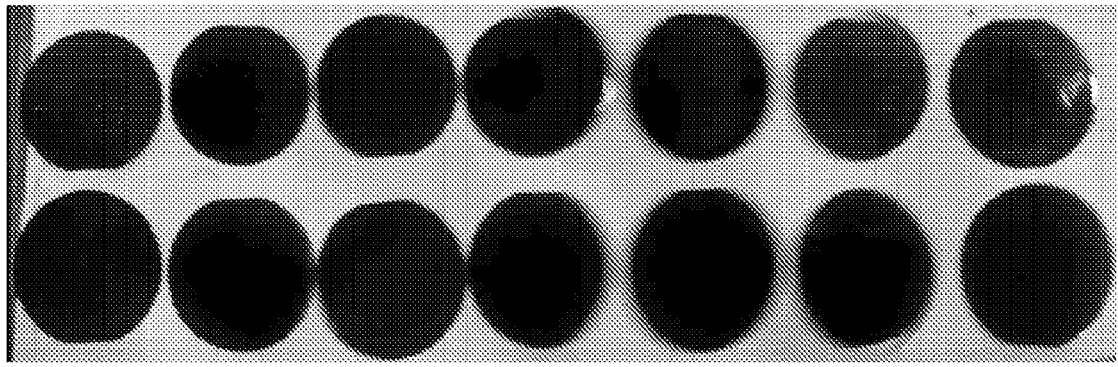
FIG. 21
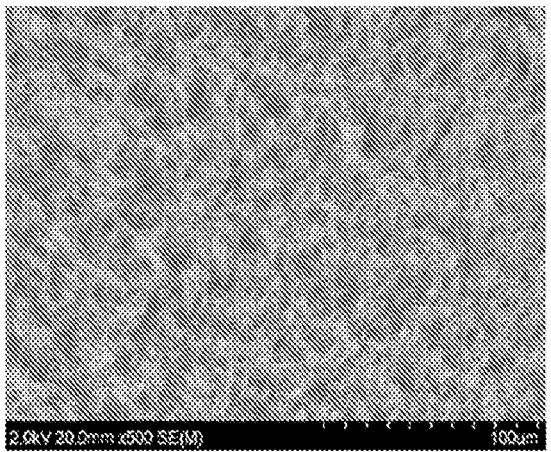 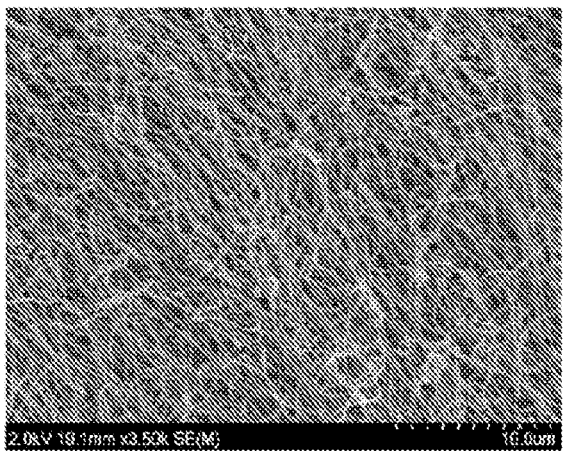
FIG. 22A  FIG. 22B

CONTINUOUS PRODUCTION OF NANOFORESTS

CROSS-REFERENCE TO RELATED APPLICATIONS

This application claims priority to and the benefit of the filing of U.S. Provisional Patent Application No. 63/049,885, filed on Jul. 9, 2020, entitled "Large Scale Continuous Production of Nanoforests", the entirety of which is incorporated herein by reference.

BACKGROUND OF THE INVENTION

Field of the Invention (Technical Field)

The present invention is related to mass production of carbon nanotube nanoforests.

Background Art

Note that the following discussion may refer to a number of publications and references. Discussion of such publications herein is given for more complete background of the scientific principles and is not to be construed as an admission that such publications are prior art for patentability determination purposes.

The unique properties of carbon nanotubes (CNTs) strongly depend on various parameters such as structural configurations, lattice structural perfection, chirality, diameter, length, purity, etc. Since their discovery numerous synthesis techniques have been introduced, some of which are widely being used as efficient growth methods. Carbon nanotubes are usually synthesized by three main techniques: arc-discharge, laser ablation, and chemical vapor deposition (CVD), each of which requires different growth parameters and conditions. The growth mechanism of CNTs is not well known to researchers, leading to the suggestion of various growth theories. In general, the carbon source, catalyst particles, and specific atmospheric conditions at which CNTs can grow are the three most important elements for the growth of CNTs. The actual growth mechanism of CNTs is almost the same for all techniques, and the most common theory suggests that the metal catalyst particles are either floating (weak interaction) or supported (strong interaction) on the substrate. For example, when the precursor (i.e., carbon source) is mixed with a catalyst in the form of a liquid which is introduced into the reaction region where the appropriate atmospheric conditions exist (the liquid injection technique), the heavier metallic particles deposit/precipitate first, and then the decomposed reactive atomic carbons diffuse into or dissolve onto the metal catalyst particles. After reaching super-saturation, they often first form a fullerene dome and then extend into a carbon cylinder, creating CNTs.

The chemical vapor deposition (CVD) technique is one of the very simple and economical ways of producing CNTs. In general, a mixture of hydrocarbon and metal catalyst particles (in the vapor phase) is introduced through an inert gas flow (e.g., Ar or a mixture of Ar and $H_2$) into a quartz tube furnace containing a substrate. The hydrocarbon source is thermally decomposed in the presence of catalyst particles at a sufficiently high temperature (600-1200° C., depending on the type of the hydrocarbon source), and then CNTs grow over the catalyst particles which are deposited on the substrate surface. The CVD synthesis technique can accommodate a variety of hydrocarbons (e.g., CO, toluene, benzene, xylene, mesitylene, ethylene, benzene, acetylene, methane, ethanol, camphor, and naphthalene) as the carbon source and catalysts (e.g., transition metal such as Fe, Ni, Co, Mo, and alloys thereof) in the gas, liquid, or solid state form to grow CNTs on various types of substrates (e.g., glass, Si, $Si_2O$, Quartz, SiC, mica, alumina). It also allows the CNTs to grow in various structural configurations, such as single walled carbon nanotubes (SWCNTs), double walled carbon nanotubes (DWCNTs), and multiwalled carbon nanotubes (MWCNTs), and in a variety of forms (e.g., powder, thin or thick films, straight or coiled, and aligned or entangled), depending on the main growth parameters (i.e., hydrocarbon, catalyst, and temperature). In general, CVD provides better control over the growth parameters. The morphology and textural properties of the substrate greatly affect the yield and quality of the synthesized CNTs. It has been demonstrated that the catalyst particle size dictates the diameter of the grown CNTs. SWCNT growth typically requires the use of catalyst particles with dimensions less than about 2 nm, DWCNT growth typically requires the use of catalyst particles with dimensions about 4 nm, while the use of larger catalyst particles typically leads to MWCNT formations. FIG. 1 shows a schematic of a simple CVD system in which catalyst particles are deposited on the surface of a substrate prior to the CVD process.

High quality growth of SWCNTs has been accomplished using metallic copper particles (calcined in air at 700° C. prior to the CVD process) as catalysts, which were normally considered contaminants in the growth of SWCNTs. Cu, as a non-ferromagnetic catalyst, has high catalytic activity for SWCNT growth which can greatly benefit the study of the magnetic properties of SWCNTs in the absence of Fe or other transition metals. CVD growth of SWCNTs using highly activated noble ultra-thin (i.e., about 3 nm or less in diameter) nanoparticles (e.g., Au, Ag, Pt, and Pd) as catalysts has been demonstrated. To activate the catalyst particles, they were heat treated in air (atmospheric heating) at 800° C. just before the start of the CVD process with no exposure to air between the atmospheric heating and CVD process. Random networks and horizontally aligned arrays of SWCNTs growth were observed. Furthermore, to enhance the catalytic activity lifetime of the catalyst particles in the CVD process and more efficiently synthesize impurity-free SWCNTs, a very small and controlled amount of water vapor can be used as a weak oxidizer that selectively removes amorphous carbon from the surface of the catalyst particles without damaging the nanotubes at growth temperatures. As a result of water-assisted CVD, massive growth of super dense and vertically aligned SWCNT forests with heights up to 2.5 mm (by about a 10-minute CVD process) were observed, where the SWCNTs can easily be separated from catalyst particles to obtain high purity CNTs (i.e., above 99.98%). It is suggested that water-stimulated growth could enhance the efficiency of the other CVD growth systems for the synthesis of MWCNTs as well.

Owing to their superior material properties, CNTs are one of the best candidates to be used as an effective reinforcing material. A 3-D multifunctional hierarchical nanocomposite has been manufactured using a recent technique to grow carbon nanotubes in the perpendicular (through-the-thickness) direction on silicon carbide (SiC) fibers and woven cloths similar to a nano-brush and nano-forest. Using the nano-forest layers a truly 3-D laminated nanocomposite with superior through-the-thickness properties was fabricated. Moreover, the nanocomposite has multifunctional capabilities, such as increased mechanical properties as well as manipulation and control of coefficient of thermal expansion, electrical conductivity, thermal conductivity, and structural damping. The material properties of the 3-D laminated nanocomposite, such as fracture toughness GIC, GIIC, flexural modulus, flexural strength, flexural toughness, damping, coefficient of thermal expansion, through-the-thickness thermal conductivity, and through-the-thickness electrical conductivity, can be improved by about 348%, 54%, 5%, 140%, 424%, 514%, −62%, 51%, and 10E+6, respectively. These results show the effectiveness of the proposed solution for improvement of the through-the-thickness materials properties and multifunctionality of the laminated composites by means of additional radially aligned CNTs reinforcements over the fiber cloths. The CNTs were also shown to be directly grown on commonly used fiber architectures such as glass, Kevlar, and carbon. Once CNTs are grown on fibers and fiber cloths, the same procedures for matrix impregnations, lay-up laminations, and curing, as used in a traditional wet lay-up technique for composites manufacturing, can be used to develop 3-D hierarchical nanocomposites with superior through-the-thickness properties and multifunctionality. Carbon nanotubes do not tend to grow on all types of fibers used as reinforcements in composites and hierarchical nanocomposites. The primary criterion for CNT growth is that substrate has an oxide layer on it or as part of it. Hence, CNTs grow easily on SiC fibers due to the Si—O—C chemistry in SiC fibers. For fibers with no oxides present in them, a thin layer of SiC coating can be applied using a pre-ceramic polymer and then upon pyrolysis with proper thickness and technique CNTs can be grown. This technique is advantageous in fibers where no oxide layer is inherently present i.e., carbon, Kevlar, and glass fibers.

As shown in FIG. 2, in Transverse Nanoforest Technology (TNT) or "Nanoforest I" (NF I), a CNT forest grows on the surface of fibers or fabric plies, allowing neighboring plies to interlock with each other like Velcro®. NF I, a micrograph of which is shown in FIG. 3, is an example of a Vertically Aligned CNT Nanoforest (VA CNT NF). NF I fills in the weak, matrix-rich zone between the plies with reinforcement in the transverse direction of the laminate. This results in a 3-dimensional nanocomposite with dramatically improved interlaminar fracture toughness, hardness, delamination resistance, in-plane and out-of-plane mechanical properties, damping, thermoelastic behavior, and thermal and electrical conductivities, making the structure multifunctional. It is notable that the NF I Technology for VA CNT NF accommodates nanotubes with lengths of several millimeters. These lengths are more than enough to span the distance between plies in a laminate as shown in FIG. 2. However, this length must be optimized to produce the best results using NF I technology.

A liquid based (Ferrocene plus Xylene) CVD approach was employed to grow Multi-Walled CNTs (MWCNTs) normal to the surface of the fibers, completing Step 1 in FIG. 2A, and establishing NF I. In Step 2 the nanoforested fabric can be made into prepreg or used directly in a wet layup. In Step 3 pressure and temperature (e.g., mold, autoclave, etc.) are used to consolidate the composite laminate. It should be noted that in addition to the improvements in out-of-plane transverse properties, the in-plane properties, both physical and structural, will also be improved, but to a lesser extent than the transverse properties. The transverse damping factor, flexural modulus, flexural strength, and flexural toughness increased by about 615%, 105%, 140%, and 525%, respectively. Significant increases in fracture toughness as well as thermal and electrical conductivity, and reduction in the coefficient of thermal expansion (CTE), also occurred. Preceramic polymers have been used to make Continuous Fiber Ceramic Composites (CFCCs) with NF I and a very low loading of nanomaterials, achieving substantial improvements in flexural strength (about 40%), flexural toughness (about 60%), and elastic modulus (about 20%). NF I produces hierarchical multifunctional nanocomposites, as it ranges from nano-tubes to micro-fibers to macro-composites and enhances properties in many different areas.

CNT-based Nanoforest II (NF II), or Nano-Tape as a Prepreg & Wet Lay-up Technology, a new class of nano-reinforcements, was developed at the Hawaiian Nanotechnology Laboratory (HNL) at University of Hawai'i at Mānoa, is shown in FIG. 4A. This was used to reinforce (for strengthening as well as toughening): a) resin (for any kind of polymer, be it thermosetting, thermoplastic, or preceramic polymer) to produce nanocomposites with performances higher than those of the resin; b) a composite system by interleaving it within regular continuous fiber composite, as shown in FIG. 4B, (for any type of fiber materials, such as carbon, glass, Kevlar, Spectra, silicon carbide, alumina, etc. or a hybrid/combination of them) and for any kind of fiber architecture (such as unidirectional, 2D woven, 3D triaxial/braided, etc. or any combinations) thereof for either a wet lay-up or a prepreg-based polymer (for any type of polymer, such as thermosetting, thermoplastic, or preceramic polymer) to produce high-performance hierarchical (since the manufacturing is a bottom-up approach from nanotape to microfibers to macro composites), multifunctional (since many different properties are improved) nanocomposites; c) within the adhesives for joining two adherents, and d) to locally reinforce to strengthen and toughen the regions of stress concentrations at and around the joint areas and cut-outs (such as holes) and where mechanical fasteners are needed for composites to locally reinforce to strengthen and toughen regions of stress concentration.

The Aligned Nano-Tape (NF II) technology is applicable to a great majority of polymer composite manufacturing techniques be it room temperature cure, autoclave cure, compression molding, resin transfer molding (RTM), open or closed mold vacuum assisted resin transfer molding (VARTM), reaction injection molding (RIM), structural reaction injection molding (SRIM), elastic reservoir molding (ERM), sheet molding compound (SMC), manual or automated and wet lay-up or prepreg role wrapping, co-cured sandwiched structures, pultrusion, manual or automated and wet lay-up or prepreg tape laying, in-situ (on-line consolidation) thermoplastic composites tape laying, filament winding by in-situ (on-line consolidation) thermoplastic composites tape laying, diaphragm forming, matched die forming, hydroforming, thermoforming, etc.; and for any geometry, be it flat, curved, contoured, and multi-curvatured. It can be applied locally (i.e., around certain regions where the properties need to be improved locally) or globally (i.e., for the entire structure, where the properties need to be improved everywhere in the structure).

The property improvements of the structures containing NF II can be in a variety of fields such as physical, chemical, mechanical both static (strength, stiffness, strain, toughness, etc.), and dynamic (fatigue, impact, damping, etc.), electrical, thermal, etc. These property improvements can be isotropic or anisotropic depending on the orientation of the fibers and the developed Nano-Tape NF II. In addition, depending on the application, the coverage of the developed Nano-Tape NF II on the surface and/or within a composite material can be partial (i.e., locally) or full-coverage (i.e., globally). In addition, depending on the application some of the Nano-Tapes NFs II can be replaced by a thin layer of metals (e.g., aluminum foils) or polymers (thermoplastic films) if certain materials properties are required/desired.

The interleaving of the NF II within the layered structures can be sequential and in-between all the layers, or alternating with a certain period of layers, or placed only within some of the layers (see, for example, FIG. 4B). FIG. 5 shows a photograph of vertically aligned high density arrays of Multi-Walled CNTs (MWCNTs) as a NF II that can be rolled and horizontally aligned to be interleaved inside composite layers, as shown in FIG. 6. The property improvements of the resulting nanocomposites from NF II in both physical and mechanical properties can be very similar to those of NF I described above.

Various methods for the growth of carbon nanotubes have been described above. For example, for the production of NF II, the CVD growth technique can be chosen due to its simplicity and ability for substantial control over the important growth parameters such as CNT length, alignment, and pattern of growth. It also enables the use of various types of substrates. FIG. 7 shows the schematic of a typical CVD system for the growth of MWCNTs. It comprises inert carrier gas source 10, syringe pump 30 for the injection of precursor/catalyst solution, high temperature furnace 60 as a reactor comprising one or more temperature controllers 70 and quartz tube 80 comprising pressure relief valve 40 in which substrate 90 is to be placed, pre-heater 50 to vaporize the precursor-catalyst mixture, gas flow meter or mass flow controller 20 to control the inert carrier gas flow rate which carries the precursor-catalyst vapor into the reaction zone inside the quartz tube, bubbler 100, and exhaust line 110. First, a substrate (e.g., quartz, silicon, silicon oxide, as well as some metallic ones such as steel) on which CNTs are to be deposited/grown is placed inside the quartz tube within the growth zone. Although CNTs cannot grow on all kinds of materials, it is possible to deposit a very thin layer of catalyst over the substrate to catalyze the CNT growth reaction. A syringe pump is loaded with precursor-catalyst solution, comprising, for example, approximately 1 gram of Ferrocene (e.g., from 98%, Sigma Aldrich) dissolved in approximately 100 ml of Xylene (e.g., from Fisher Scientific), and set with an optimum solution feeding rate that is to be injected into the pre-heating zone. After sealing the end caps of the quartz tube, inert gas (e.g., argon or a mixture of argon-hydrogen) enters the quartz tube with a high flow rate (for few minutes) to flush purge the trapped air inside the tube furnace. When the temperature of the furnace reaches ~400° C., the inert gas flow rate is preferably reduced to the optimum flow rate (e.g., 30-60 CC/min, but these values can change depending on the size of the furnace and substrate) at which the growth of CNTs is most likely to occur. At the same time, the pre-heater is started and set to reach the evaporation temperature of the precursor-catalyst solution (i.e., 180-190° C. for the Ferrocene-Xylene mixture). Once the pre-heater and the quartz tube furnace reach their set temperatures (e.g., 180-190° C. for the preheater and 770° C. for the CVD furnace) the precursor solution is fed continuously at the optimum feeding rate into the two-stage tubular quartz reactor using a syringe pump. The liquid feed is passed through a capillary tube and preheated to approximately 180° C. prior to its entry into the quartz furnace. At this temperature, the precursor solution exiting the capillary is immediately vaporized and swept into the reaction zone of the furnace by a flow of pure argon gas or argon gas mixed with approximately 15% hydrogen. The inner diameter and the length of the quartz tube are typically at least approximately 50 mm and 1 meter, respectively. In the growth zone, the heavier metallic particles deposit first; then the precursor decomposes and reactive atomic carbons deposit onto and diffuse into the metal catalyst particles on the substrate, forming vertically aligned high density arrays of CNTs. The CVD reaction time depends on the desired CNT length (e.g., 30 minutes for ~50-500 μm long CNTs, or a variation of these values depending on the conditions of the furnace and parameters of the processing). Finally, the pre-heater and the furnace are turned off and allowed to cool down to room temperature in the flowing inert gas environment, after which the produced CNTs are extracted.

The growth parameters such as argon gas flow rate, quartz tube furnace temperature, pre-heater temperature, location of the substrate inside the quartz tube, and Ferrocene-Xylene injection rate that are listed above can be optimized depending on the size, configuration, and condition of the furnace and substrate to obtain desirable CNT nanoforests. FIG. 8 shows a rather smaller CVD system (i.e., a 2-inch quartz-tube furnace) which is used for the growth of multi-walled carbon nanotubes (MWCNTs). For example, the growth parameters listed above are obtained for the system shown in FIG. 8 and they can be adjusted for different set ups and systems. CVD furnaces with other dimensions, such as a 6-Inch CVD furnace, can also be used for the growth of CNT nanoforests.

Using a CVD system, as described above, vertically aligned high density array CNT Nanoforests up to ~7 mm long can be successfully grown on substrates such as silicon oxide, steel, SiC fibers, or pre-ceramic coated fibers with different patterns and architectures. FIG. 9 shows a typical silicon oxide substrate with dimensions of 1 inch by 1 inch with NF II on it after about a 1 hour CVD process in the system shown in FIG. 8. The length of the CNTs on this sample is approximately 1 mm long.

Depending on the duration of the CVD process and furnace conditions, CNTs with various lengths can be obtained. It is believed that the growth of CNTs will continue as long as the catalytic activity of the catalyst particles is not interrupted. A HITACHI S-800 field emission Scanning Electron Microscope (SEM) and a Zeiss (LEO 912) energy-filtering Transmission Electron Microscope (TEM) were used to study and inspect the features, alignment, architecture, and size of the CVD grown CNTs. FIG. 3 shows a SEM image of a vertically aligned CNT Nanoforest. Appropriate scale bars are printed at the right bottom corner of each image. Using a Zeiss (LEO 912) energy-filtering TEM, images from individual CNTs were obtained and are shown in FIGS. 10A and 10B, in which the average diameter of the CNTs (MWCNTs) is roughly measured at about 40-60 nm.

The main advantage of composites, in addition to their high specific strength and stiffness, is their ability to be tailored towards a specific loading condition, i.e., placing the load carrying fibers where the loadings and stresses are. Fibers usually are very strong in the longitudinal direction but weak in the lateral direction. Therefore, when they are used to make structural composites, the final product will be weak in through-the-thickness direction. In addition, the in-between layers in a composite contain only matrix material which is weak compared to fiber properties. This weakness often leads to interlaminar failures (such as delamination) in composites under various loading conditions. To overcome this problem, 3-D composites such as 3-D stitching and 3-D braiding have been proposed. The use of 3-D braided fiber architecture is limited to some specific applications and geometries. As far as the stitching is concerned, once again, the thickness should be determined and then stitching performed. In this case, the fibers can be orthogonal; however, the post operation of stitching is performed only after the structure is designed to determine the thickness to be stitched to provide through-the-thickness fibers. In addition, while stitching can improve some through-the-thickness properties to some extent, it reduces the in-plane properties. In addition, traditional composites lack multifunctionality.

SUMMARY OF THE INVENTION
(DISCLOSURE OF THE INVENTION)

An embodiment of the present invention is a method for continuous production of nanoforests, the method comprising: unrolling a flexible substrate from a feed roll into a first furnace; growing a first nanoforest comprising first nanotubes or first nanowires on the substrate as it passes through a first growth zone in the first furnace; cooling the first nanoforest in a first cooling zone; and rolling the nanoforest-coated substrate onto a first take-up roll. The method preferably comprises inserting a separator, for example a polyimide film, between adjacent layers of the nanoforest-coated substrate during the rolling step. The first nanotubes or first nanowires preferably comprise carbon, BN, Si, CuO, or ZnO. The method preferably comprises maintaining tension on the flexible substrate. The method may optionally be performed simultaneously on multiple parallel substrates, which can be arranged vertically or horizontally relative to each other. The method preferably comprises controlling one or more parameters selected from the group consisting of unrolling speed, rolling speed, substrate tension, precursor flow rate, carrier gas flow rate, furnace temperature, and preheater temperature. The method of claim 1 preferably comprises measuring a thickness of the first nanoforest during the growing step. The first furnace is enclosed during operation. When the feed roll runs out of substrate, the method preferably comprises closing an airlock between an enclosure housing the feed roll and the furnace; loading a new feed roll; splicing the substrate on the feed roll and the substrate on the new feed roll; purging the enclosure; and opening the airlock. When the take-up roll is full, the method preferably further comprises closing an airlock between an enclosure housing the take-up roll and the furnace; unloading the take-up roll; loading a new take-up roll; purging the enclosure; and opening the airlock. The substrate preferably comprises fibers, a fabric, or a flexible metal. The growing step optionally comprises growing the nanoforest on both sides of the substrate. The method preferably further comprises separating the nanoforest from the substrate.

The first nanotubes or first nanowires are optionally oriented substantially perpendicular to a surface of a substrate. In this case, the method preferably further comprises, after the cooling step: rolling the nanoforest to form a collapsed layer comprising the first nanotubes or first nanowires, wherein in the collapsed layer the first nanotubes or first nanowires are oriented substantially parallel to the surface of the substrate; growing a second nanoforest comprising second nanotubes or second nanowires on the collapsed layer as it passes through a second growth zone in the first furnace, the second nanotubes or second nanowires oriented substantially perpendicular to a surface of the substrate; and cooling the second nanoforest in a second cooling zone. Or, the method alternatively optionally comprises, after the rolling step: unrolling the nanoforest-coated substrate from the first take-up roll through rollers to form a collapsed layer comprising the nanotubes or nanowires, wherein in the collapsed layer the first nanotubes or first nanowires are oriented substantially parallel to the surface of the substrate; growing a second nanoforest comprising second nanotubes or second nanowires on the collapsed layer as it passes through a second growth zone in the second furnace, the second nanotubes or second nanowires oriented substantially perpendicular to the surface of a substrate; cooling the first nanoforest in a second cooling zone; and rolling the nanoforest-coated substrate onto a second take-up roll. In the latter embodiment, the second furnace is optionally the same as the first furnace and the method preferably comprises: inserting a first separator between adjacent layers of the nanoforest-coated substrate during the first rolling step; removing the separator after the second unrolling step; and inserting a second separator between adjacent layers of the nanoforest-coated substrate during the second rolling step.

Another embodiment of the present invention is a system for continuous production of nanoforests, the system comprising: a carrier gas supply; a precursor supply; a preheater; a furnace comprising a first growth zone; a stepper motor; a feed roll for supplying a flexible substrate to the furnace; a first showerhead for depositing precursor on the substrate passing through the first growth zone; a first cooling zone; and a take-up roll for receiving nanoforest-coated substrate. The system preferably comprises a separator roll for inserting a separator, for example a polyimide film, between adjacent layers of the nanoforest-coated substrate. The nanoforest preferably comprises nanotubes or nanowires which preferably comprise carbon, BN, Si, CuO, or ZnO. The system preferably comprises a tensioner for maintaining tension on the flexible substrate. The system optionally comprises an additional feed roll and an additional take-up roll for simultaneously growing a nanoforest on a second substrate in parallel with the substrate. When the nanoforest is a vertical nanoforest, the system preferably further comprises a pair of rollers to collapse a nanoforest grown in the first growth zone from being oriented substantially perpendicular to the substrate to being oriented substantially parallel to the substrate; a second growth zone; a second showerhead for injecting precursor into the second growth zone; and a second cooling zone. The system preferably comprises a plurality of sensors, a plurality of actuators, and a controller for providing feedback control of one or more parameters selected from the group consisting of unrolling speed, rolling speed, substrate tension, precursor flow rate, carrier gas flow rate, furnace temperature, preheater temperature, nanoforest density, and nanoforest thickness. The furnace is preferably enclosed during operation, in which case the system preferably comprises an airtight first housing for the feed roller; a first airlock between the first housing and the furnace; an airtight second housing for the take-up roller; and a second airlock between the second housing and the furnace. The first housing and the second housing preferably at least partially comprise a transparent material. The furnace is preferably a chemical vapor deposition (CVD) furnace. The furnace preferably comprises a quartz, sapphire, or borosilicate viewport. The substrate preferably comprises fibers, fabric, or a flexible metal. The system is optionally configured to grow a nanoforest on both sides of the substrate.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate the practice of embodiments of the present invention and, together with the description, serve to explain the principles of the invention. The drawings are only for the purpose of illustrating certain embodiments of the invention and are not to be construed as limiting the invention. In the drawings:

FIG. 1 is a schematic of a simple chemical vapor deposition system utilizing the gas injection technique for growing carbon nanotubes.

FIG. 2A is a schematic of NF I technology.

FIG. 2B shows bare cloth and cloth with NF I.

FIG. 12A is a photograph of two typical separate pieces of VA-CNT-NFs NF II.

FIG. 12B is a photograph of two typical pieces of VA-CNT-NFs NF II placed next to each other at the edges on a matrix film to be interleaved in between fiber fabrics as film-stacked composites.

FIG. 13 is a schematic demonstrating how a 4-piece stitching can be extended to a much larger number of pieces to produce a large amount of nano-tapes NF II and/or NF III of the present invention.

FIG. 21 is a photograph showing CNT growth runs on 4" $SiO_2$ in a 6" furnace run in static/batch mode.

FIG. 22A is an SEM image showing the top view of CNT grown in the 6" furnace.

FIG. 22B is an SEM image showing the side view of the CNT grown shown in FIG. 22A.

DETAILED DESCRIPTION OF EMBODIMENTS OF THE INVENTION

To create NF II from multi-walled carbon nanotubes (MWCNTs), first a suitable substrate is prepared with or without a thin catalyst layer suitable for the growth of carbon nanotubes (the catalyst layer could be Fe, Ni, Co with a layer thickness of about 20 nm). The substrate is then placed inside a CVD furnace and a proper mixture of a carbon-source liquid (such as Xylene) is introduced into the CVD furnace. If the substrate does not already comprise the catalyst layer a suitable catalyst material, such as Ferrocene, is also introduced into the CVD furnace. As used throughout the specification and claims, the term "substrate" includes substrate, fiber, and fabric. The ratio is preferably 1 gr of Ferrocene to 100 ml of Xylene. The mixture is fed into the CVD furnace at a suitable temperature (preferably about 750° C.) and flow conditions to grow a VA-CNT-NF, or NF II, with a suitable height on a suitable substrate, and then cooled off to about room temperature for about 4 hours under an inert gas, e.g., Argon or acetylene. The substrate is then taken out of the CVD furnace, and the VA-CNT-NF is removed from the substrate and transferred onto a composite as desired (for example wet layup or prepreg, or within the adhesive layer).

Figure 3:
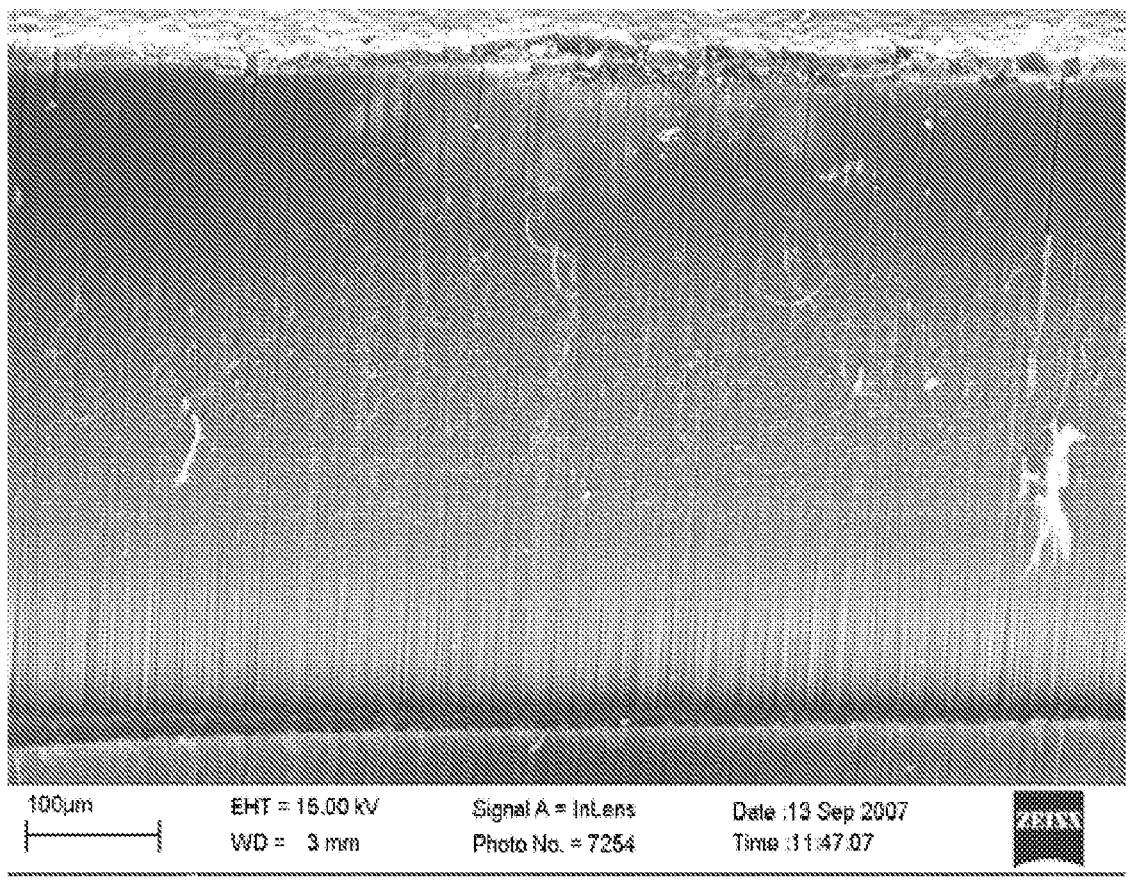
FIG. 3 is a scanning electron microscope (SEM) image of vertically aligned high density arrays of Multi-Walled CNTs (MWCNTs) forming a CNT NF grown using CVD.
Figure 4A:
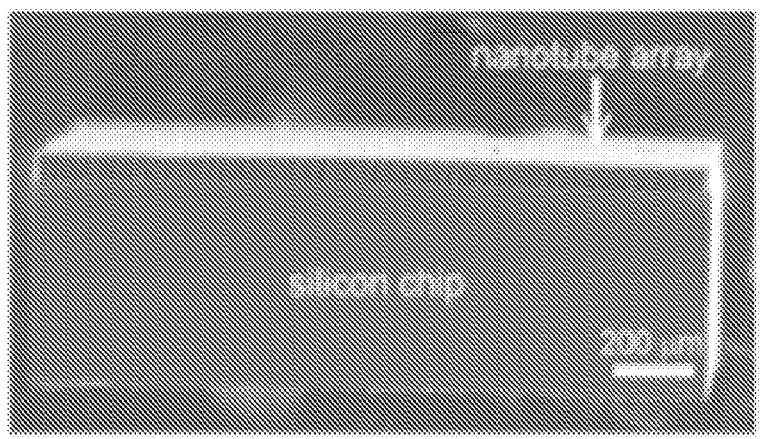
FIG. 4A shows NF II grown on a substrate.
Figure 4B:
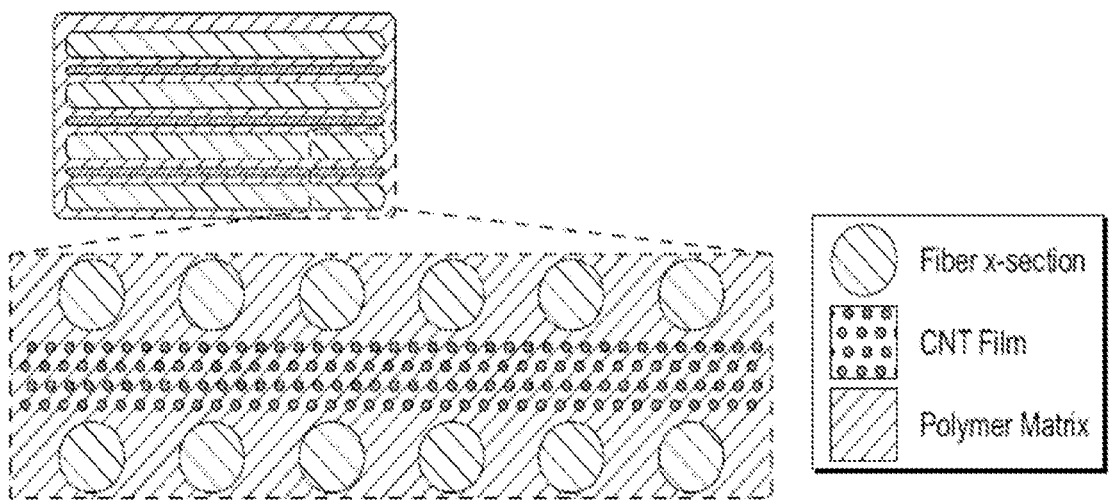
FIG. 4B is a schematic of NFII technology.
Figure 5:
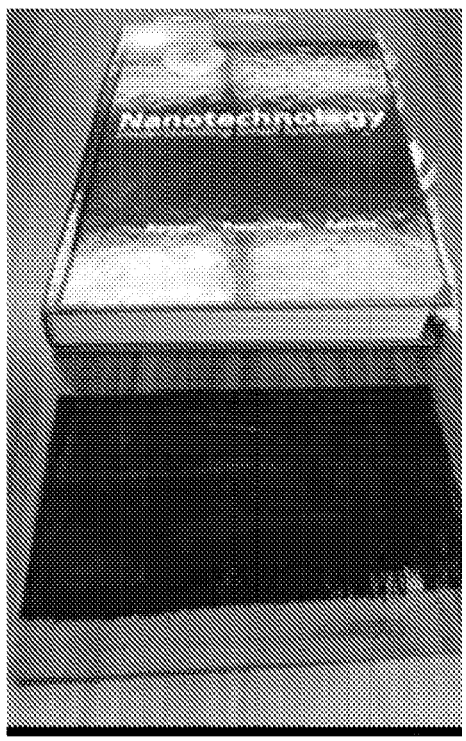
FIG. 5 is a photograph of the vertically aligned high density arrays of MWCNTs.
Figure 6:
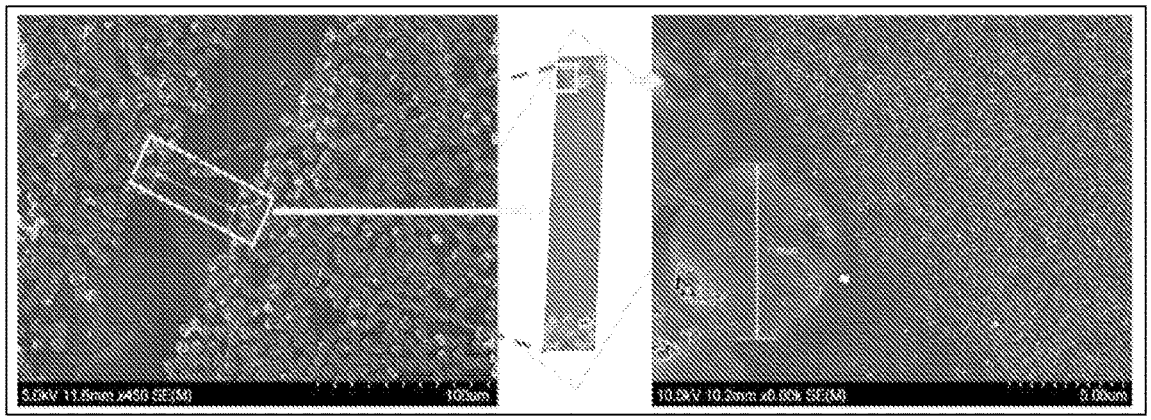
FIG. 6 shows the interlaminar distance (about 50 microns) between two plies of a composite without nanoforest (NF) carbon nanotubes (CNTs) (left image). The inset shows a nanocomposite where the interlaminar distance is filled with a horizontally aligned CNT Nanoforest (HA-CNT-NF) (e.g., a NF II). The right image shows the dimension (diameter) of a single carbon fiber as compared with the aligned horizontal carbon nanotubes within the HA-CNT-NF.
Figure 7:
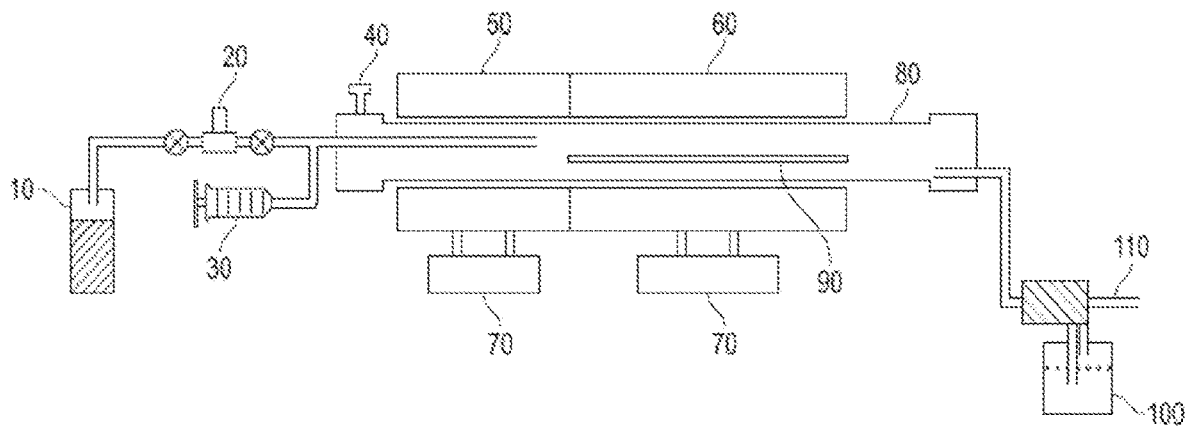
FIG. 7 is a schematic of a typical chemical vapor deposition system utilizing the liquid injection technique for the growth of multi-walled carbon nanotubes.
Figure 8:
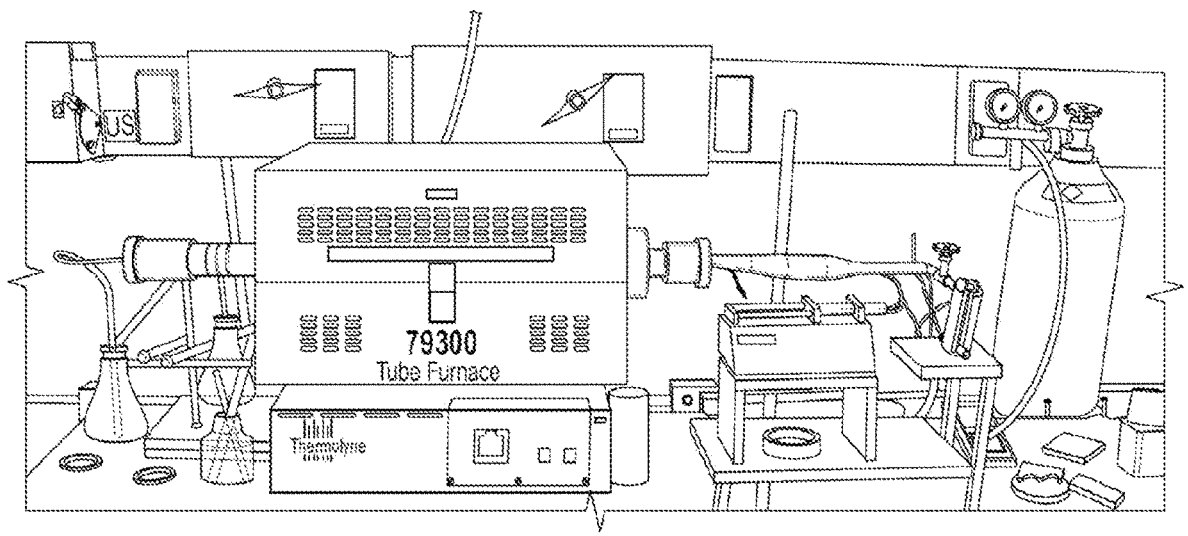
FIG. 8 is a drawing of a chemical vapor deposition system comprising a 2-inch CVD furnace for the growth of multi-walled carbon nanotubes.
Figure 9:
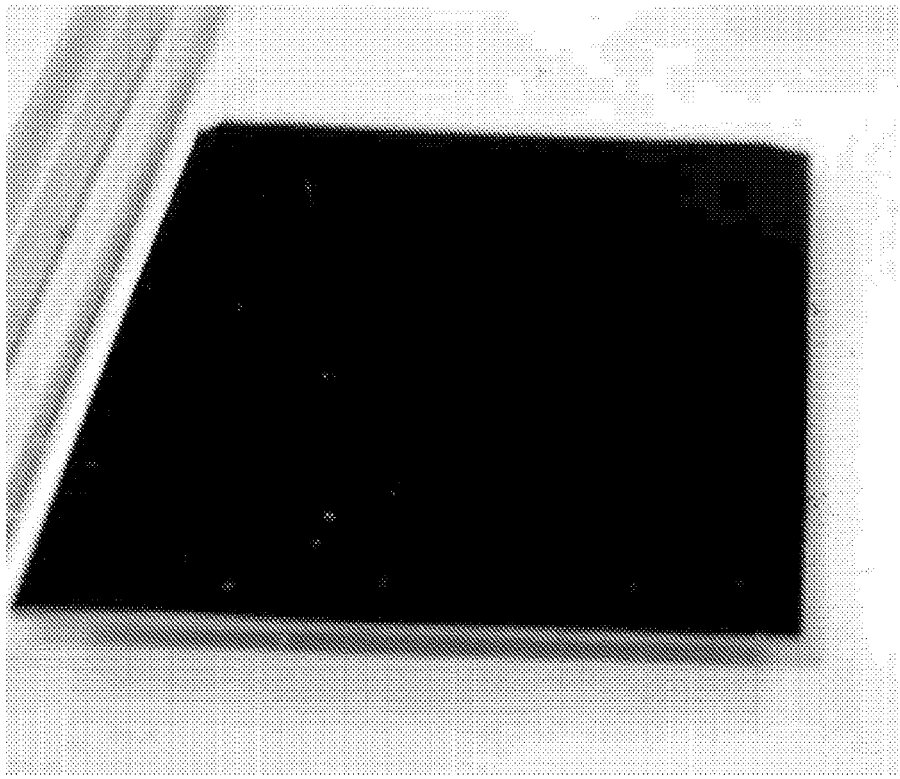
FIG. 9 shows a CNT NF grown on a 1"×1" silicon oxide substrate after nearly a one hour CVD process.
Figures 10A, 10B:
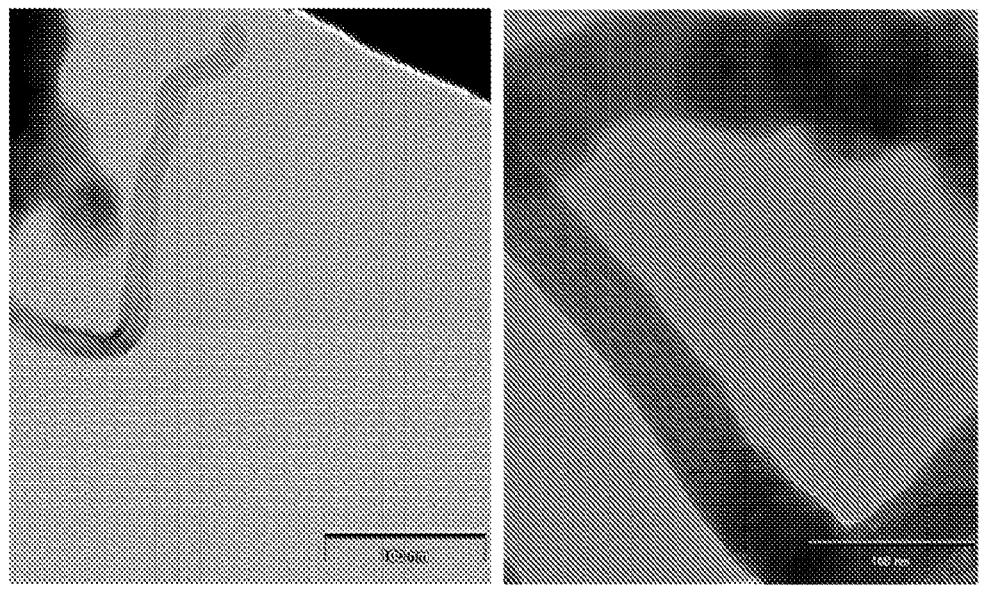
FIGS. 10A and 10B show TEM images of individual MWCNTs synthesized by CVD.
Figure 11:
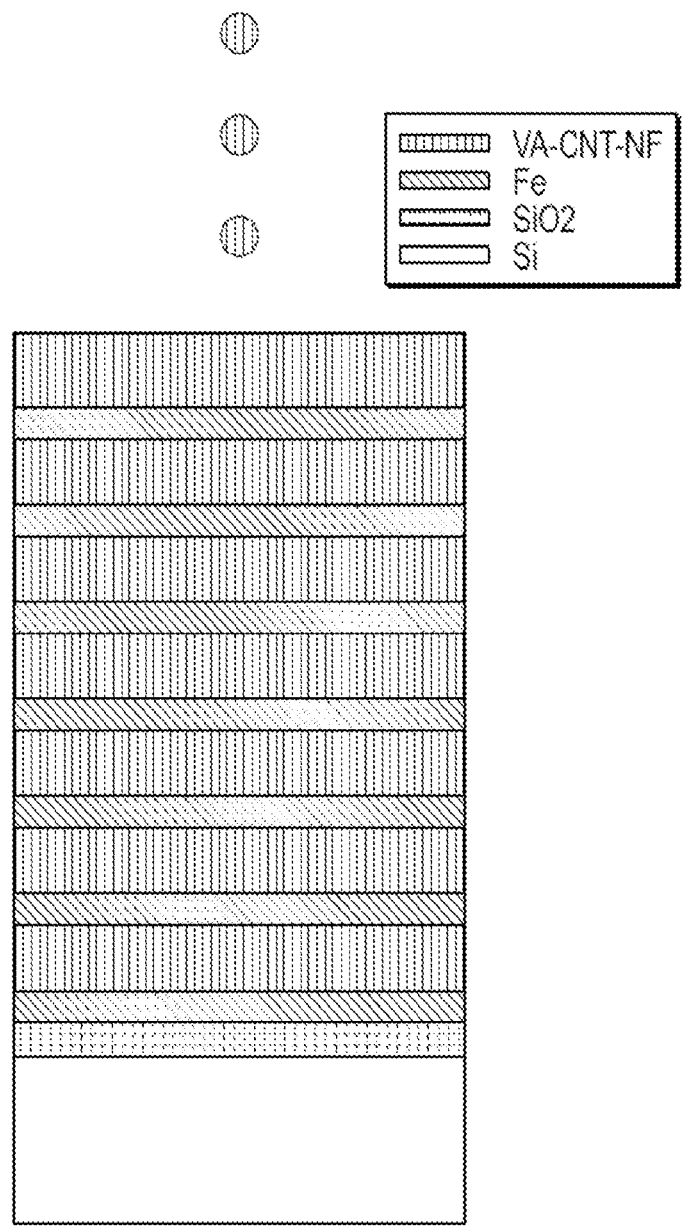
FIG. 11 is a schematic of vertically stacked VA-CNT-NFs NFs II on a single substrate for mass production.

This process can also be used for mass production. To perform mass-production of the "nanotape" in linear yards (e.g., on a roll with the width of 3 yards into many yards of a roll), individual nanotapes with a certain area (say, R square inches, based on the size of the substrate and the diameter of the CVD furnace tube) can be mass-produced at the same time by using horizontal distribution, i.e., by having many tubes (say, S number of tubes) and many wafers within each tube (say, M number of substrate/wafers per tube) of the CVD furnace. Alternatively, vertical stacking may be used, i.e., growing VA-CNT-NF NF II on top of each other on a single substrate by alternating the supply of carbon-source (Xylene) and catalyst (Ferrocene) solution at the growth temperature for the time to grow the VA-CNT-NF NF II and then turning the furnace off but passing only inert gas, Ar, for preferably about 30 minutes. The process is then repeated by alternation between these two gas flows and their corresponding temperature and flow conditions, and hence about every, for example, 60 minutes will produce one layer of VA-CNT-NF NF II, and the number of alterations of N*60 minutes will produce a stack of N VA-CNT-NF NF II. The total stack can have a height in order of millimeters. When the desired N is achieved, the furnace is turned off and preferably only the inert gas (e.g., Ar) flows over the stack until it reaches about room temperature (in about 4 hours). Next, the stacks of many VA-CNT-NF NF II on their substrates are taken out of the furnace, and the catalyst layers are etched in a chemical solution which dissolves the catalyst layers in between the NF II, and hence the NF II will float. This way the stack of N VA-CNT-NF NF II will be separated from each other and ready to be harnessed. In this method the area that is produced from a single run of a CVD furnace will be R*S*M*N square inches. Vertical stacking is shown schematically, for a typical stack on a single substrate/wafer, in FIG. 11, in which the substrate is Si with a $SiO_2$ coating and the catalyst layer is Fe; however, this approach is not limited to only this particular substrate; other substrates can also be used. The individual pieces produced in a mass-production routine can be "stacked" and "stitched" next to each other to produce a continuous wide and long role of NF II nanotape. FIG. 12A shows the picture of two typical separate pieces of VA-CNT-NFs NF II to be "stacked" and "stitched" next to each other to make a continuous roll. FIG. 12B shows the picture of two typical pieces of VA-CNT-NFs NF II, placed next to each other at the edges, on a matrix film to be interleaved in between the fiber fabrics as film-stacked composites. FIG. 13 shows schematically how a 4-piece "stitching" could be extended to a much larger number of pieces to produce large amounts of Nano-Tapes NFs II, and so on.

NF II can alternatively be mass produced horizontally by batched production, then be collapsed to convert VA-CNT-NF to HA-CNT-NF, and then VA-CNT-NF can be grown on top of the HA-CNT-NF to produce NF III in batches, and then arranging them similar to FIGS. 12A, 12B and 13 to produce mass-production batched continuous NF III.

As described above, large scale NF II can be produced in a stationary batch process. However, no studies have been performed on continuously moving substrates to accomplish CNT growth and its collection, which is important for commercial viability of NF II. While nanotapes of NF II can be "stitched" essentially to form a continuous tape as discussed above, the batch process used to manufacture the tape makes the technology extremely cost and labor intensive. Embodiments of the present invention include a novel design of a CVD furnace system for continuous, large scale, preferably spool to spool feeding of a substrate through a tube furnace preferably in a completely inert environment that can be scaled up to production systems. The system is preferably easily configured for use of various flexible substrates such as flexible metal foils and fibers or fiber tapes/fabrics. The flexibility offered by this system preferably makes the technology commercially viable.

Figure 14:
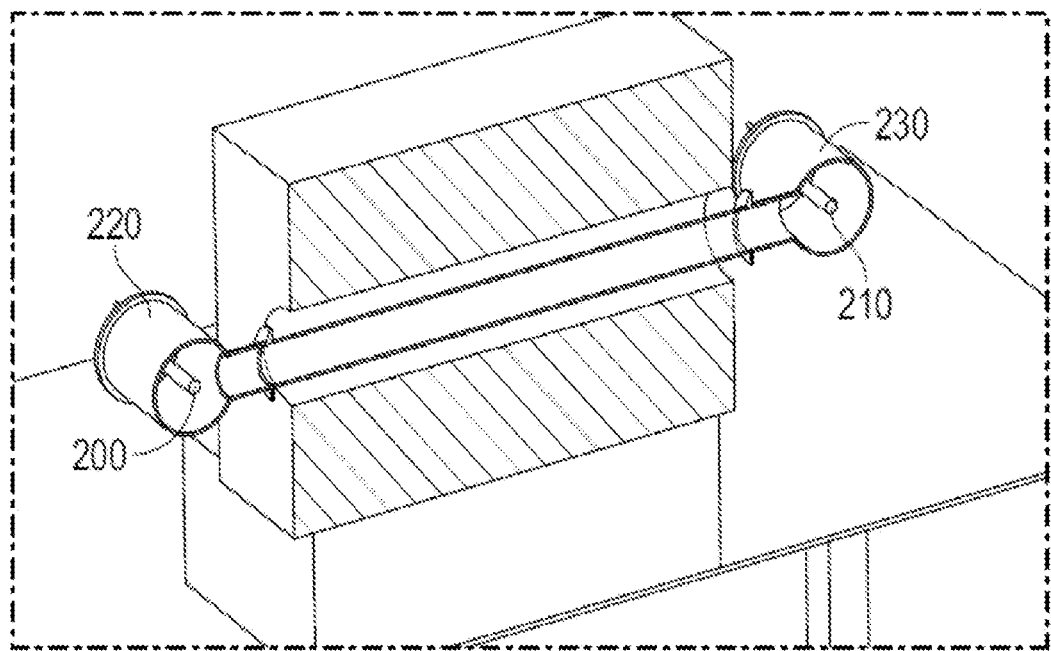
FIG. 14 is a solid model of large-scale continuous CVD furnace system demonstrating a spool-to-spool setup of the present invention.

FIG. 14 depicts a solid model of the system, which preferably comprises a tensioning system preferably controlled by one or more stepper motors (not shown) that are attached to sealed shafts or rolls 200, 210 at either side of the T-sections 220, 230 at both ends. This mechanism can be used to control the movement of substrate through the CVD system, spool-to-spool. The Ts at either end of the tube furnace preferably comprise borosilicate viewports to enable inspection of the movement of the substrate on either end of the furnace. The shafts, viewports, and endcaps of the furnace are preferably sealed by O-rings and fittings for vacuum sealing.

Figure 15:
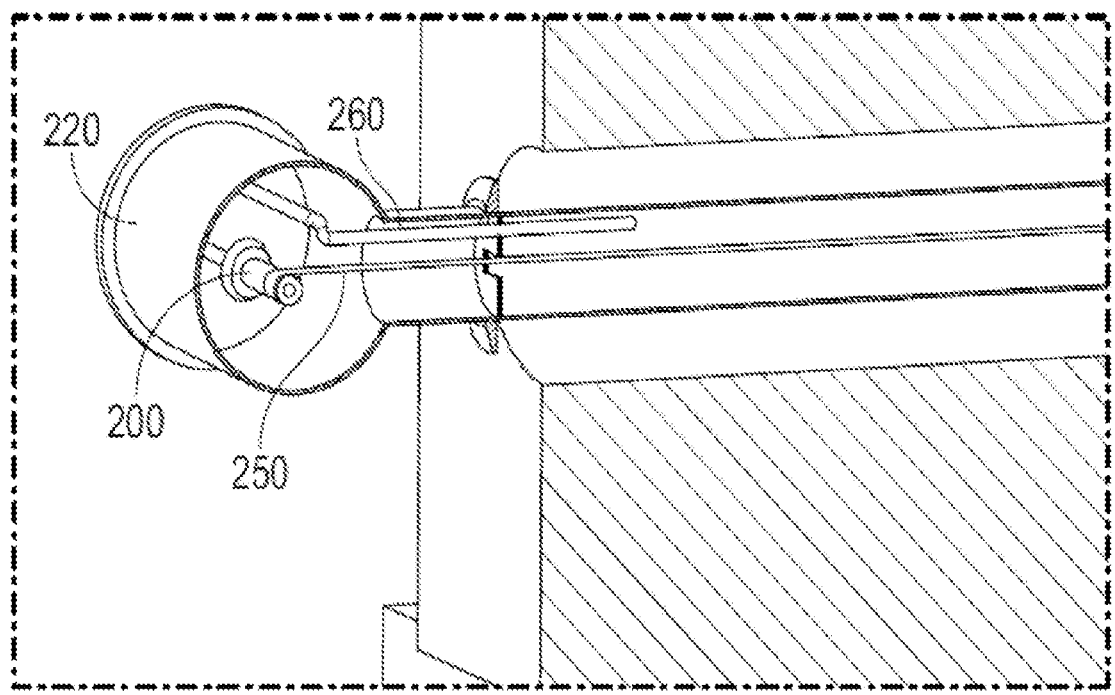
FIG. 15 is a detail of the solid model of FIG. 14 showing fiber tow placement and a gas flow inlet inside the CVD furnace of the present invention.

FIG. 15 shows a cut-away view of the solid model of the closed system furnace for continuous processing shown in FIG. 14 from the substrate feed-through end, showing substrate 250 spooled on shaft or roll 200. The substrate feed-through is preferably controlled by a motor which is connected to the shaft inside the T-fitting and computer via plug and play mechanism. In addition to controlling the feed-through system, the motor is also used to maintain the tension on the substrate between the shafts. Gas-and-precursor inlet 260 preferably comprises a stainless steel tube that directs the flow directly over substrate 250. In a very large system gas-and-precursor inlet 260 may be replaced with a series of "showers" to deliver the Xylene and Ferrocene as a continuous and distributed system. By passing a flexible substrate through the continuous feed-through system inside the CVD furnace, continuous nanoforest growth can be achieved. Process parameters established for the batch process in the tube furnace can be used and refined further to establish optimum growth on continuously moving substrates.

Figure 16:
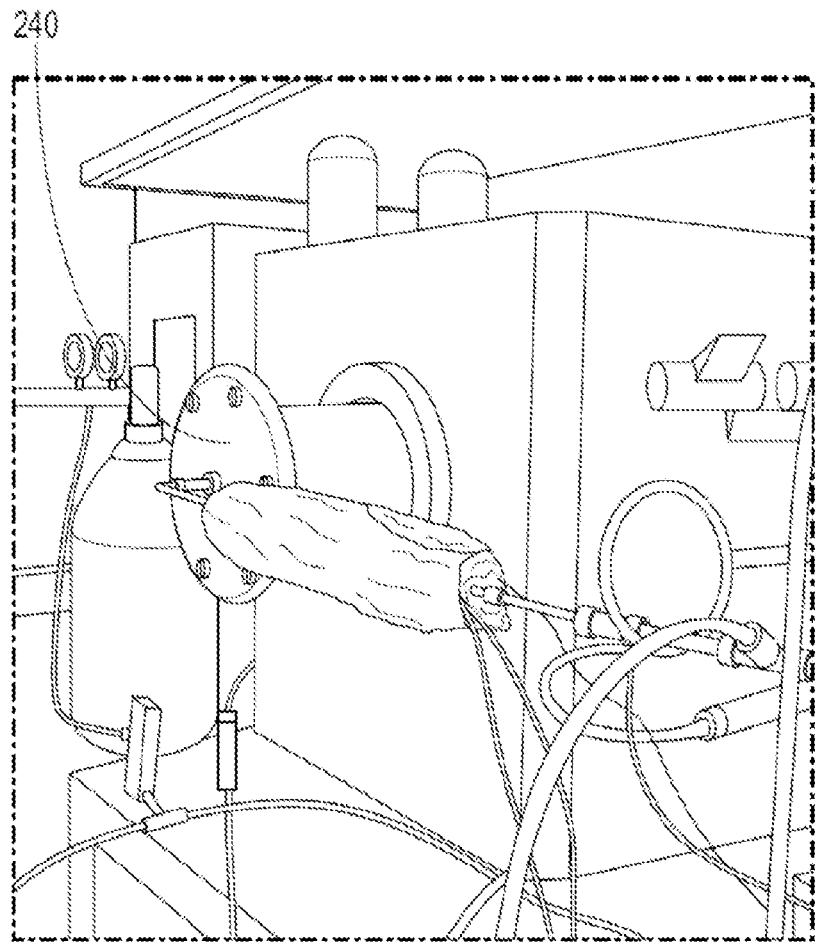
FIG. 16 is a photograph of a CVD system comprising a 6-inch CVD furnace used for the batch growth of multi-walled carbon nanotubes nanoforests.
Figure 17:
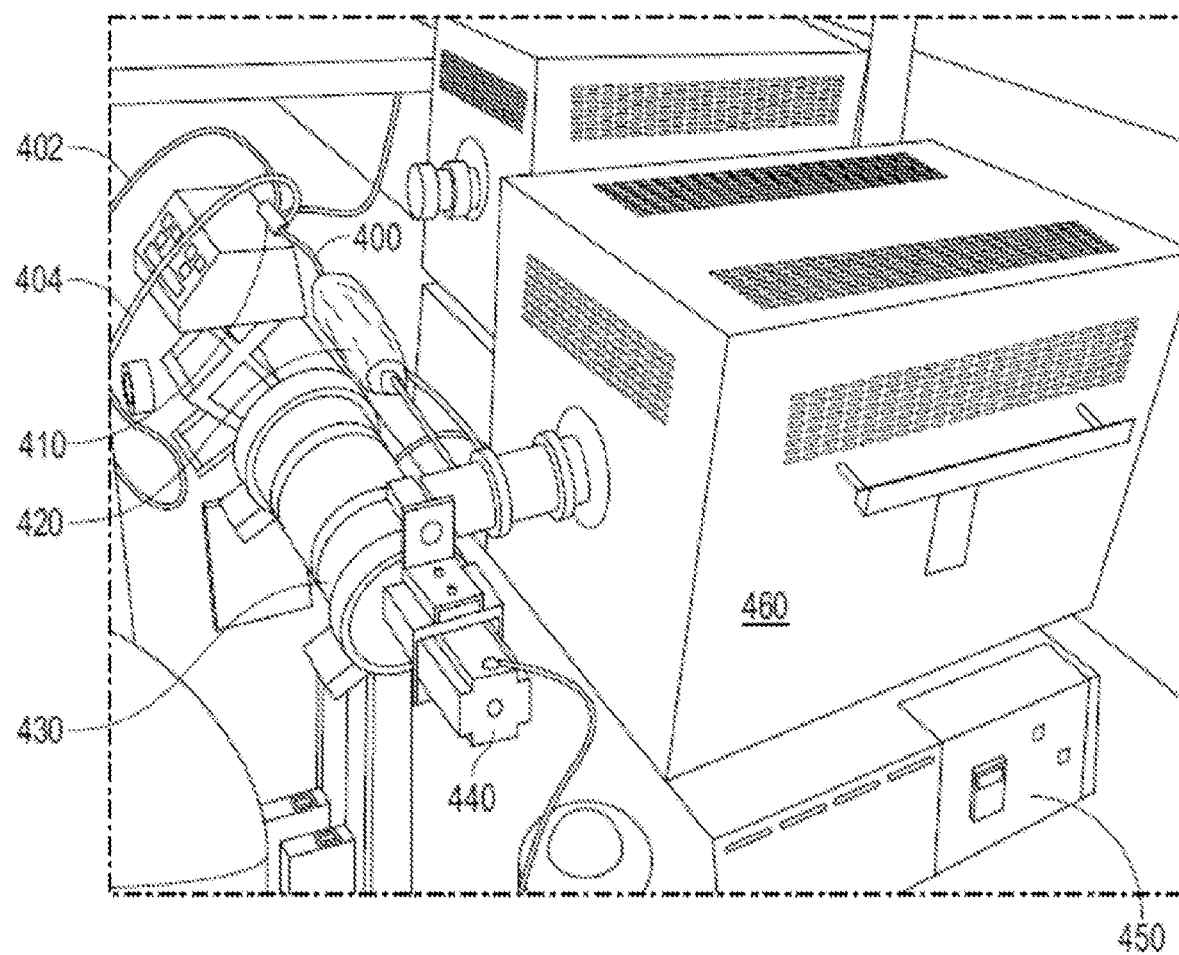
FIG. 17 is a photograph of the side of a 2" furnace system used for large-scale spool-to-spool continuous NF production, with T-fittings in place in accordance with FIGS. 14 and 15.
Figure 18A:
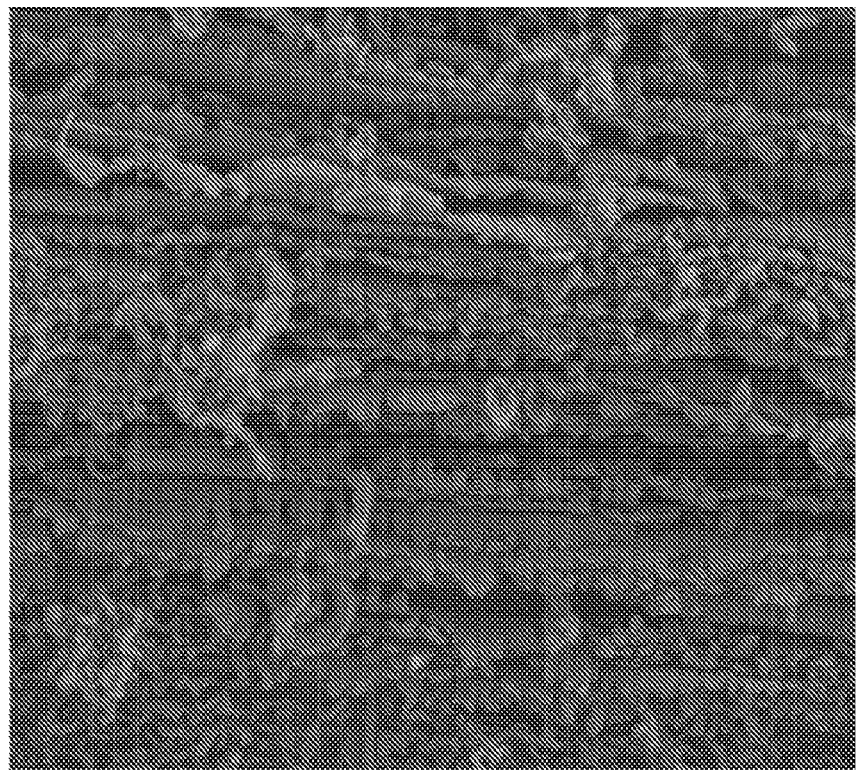
FIGS. 18A-18D are SEM images of the continuous growth of CNT on a 2-foot long carbon tape at 6", 12", 18" and 24" from the start of the tape, respectively.
Figure 18B:
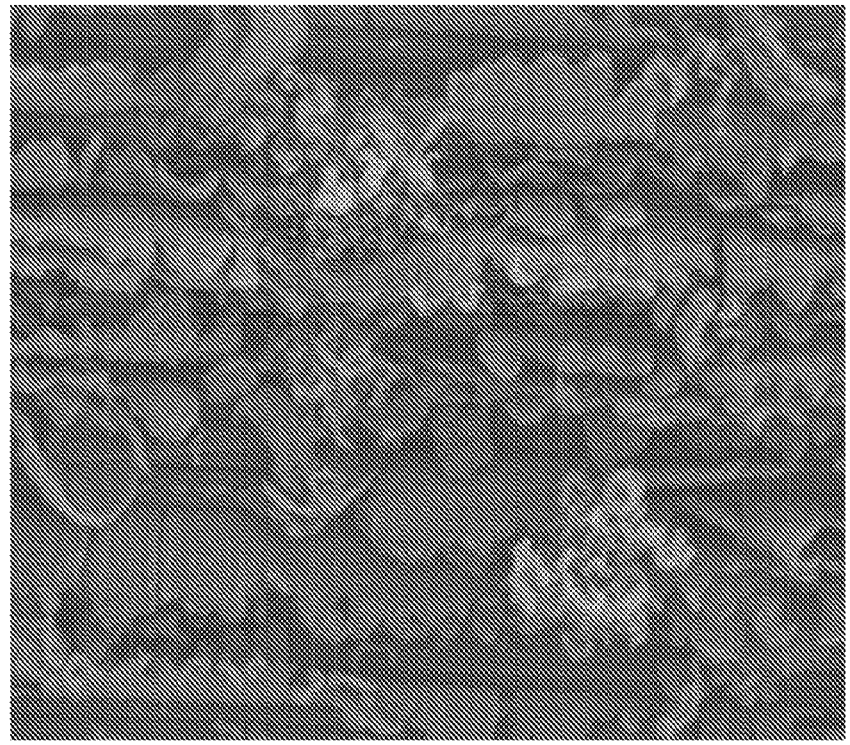
Figure 18C:
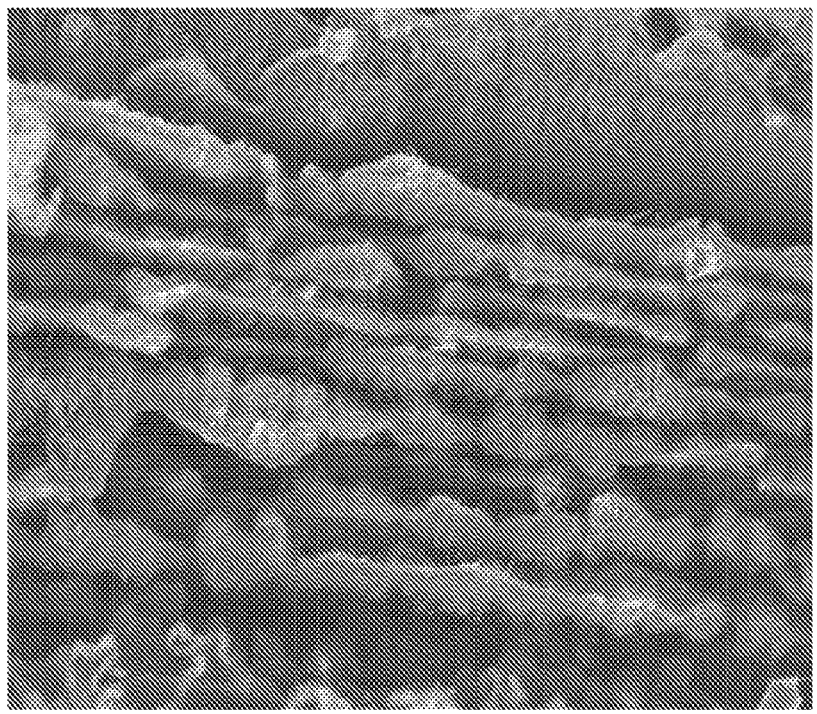
Figure 18D:
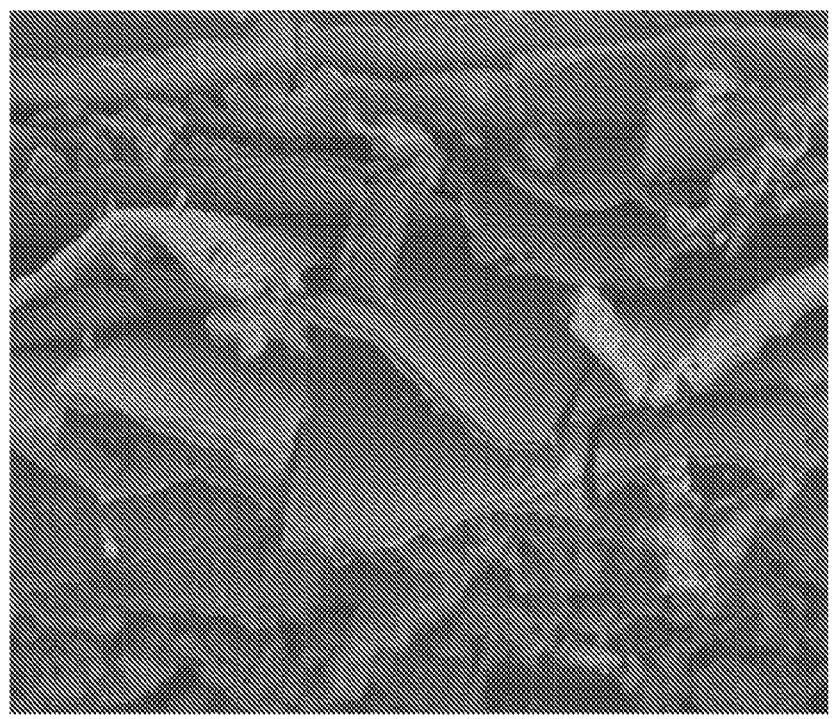

FIG. 16 shows a typical 6-inch CVD furnace for the batch growth of CNT NFs. The lightweight end caps 240 are preferably flat for ease of the design. The furnace in FIG. 17 shows a 2" batch CVD furnace modified with custom-designed end caps as T-fittings based on FIGS. 14 and 15 for continuous, roll-to-roll (or spool-to-spool) manufacture of nanoforests. Syringe pump 410 pumps the precursor through precursor feed line 400 into preheater 420, which is insulated by aluminum foil. The precursor is vaporized as it enters the furnace 460. Motor 440 spins the feed roll shaft inside roll housing (T-fitting) 430. The temperature inside furnace 460 is set using temperature control system 450 resulting in continuous production of CNT NF in the furnace. Flexible plastic tubing 402, 404 carry argon and hydrogen gases into precursor feed line 400.

A cylinder which contains the spooling mechanism for the substrate material is preferably inside the T-fitting. The other end of the T-fitting preferably has another cylinder and is coupled to the quartz tubing of the CVD furnace, which runs the substrate through the middle of the furnace. The spool inside each T-fitting is preferably driven by a stepper motor which steps in a coordinated motion with respect to each other and at a predetermined angle (for example about 1.8 degrees per step), which preferably has a predetermined holding torque (for example about 90 Ncm), and preferably has a NEMA 23 form factor. This motor enables the substrate to be fed through the furnace in predetermined (for example about 0.4 mm) increments. The material can thus "crawl" through the quartz tube at a very slow pace if need be to enable growth, or the material could be cycled through the furnace in a matter of seconds depending on the desired nanoforest growth. Both stepper motors are optionally driven by an Arduino Uno and a Dual Stepper Motor Shield. The Arduino can be connected to a computer, and it can be controlled through a graphical user interface (GUI) created in LabView. In another embodiment, only one stepper motor can drive both shafts; the motor is attached to the shaft inside the T-fitting on one end and to the other shaft on the other end's T-fitting, which can be attached to a tensioner so that the drive motor will perform the motion and the tensioner will maintain a tension on the substrate. The gas flow controllers can also be controlled by the Arduino, so that the entire process is automated and easily controlled or modified through an easy GUI. To demonstrate growth on continuously moving substrates, carbon fiber tows, tapes, and fabrics were run in the continuous CVD furnace system of FIG. 17. Uniform CNT growth was obtained over the length of the fabrics. The fabrics were run to maintain a constant time in the growth zone to enable growth. To characterize the growth, a 2-foot carbon fiber tape was cut at every 1.5 inches to characterize the growth of CNTs. FIGS. 18A-18D show images of CNT growth on the carbon tape from start to end taken at 6" intervals.

Figure 19:
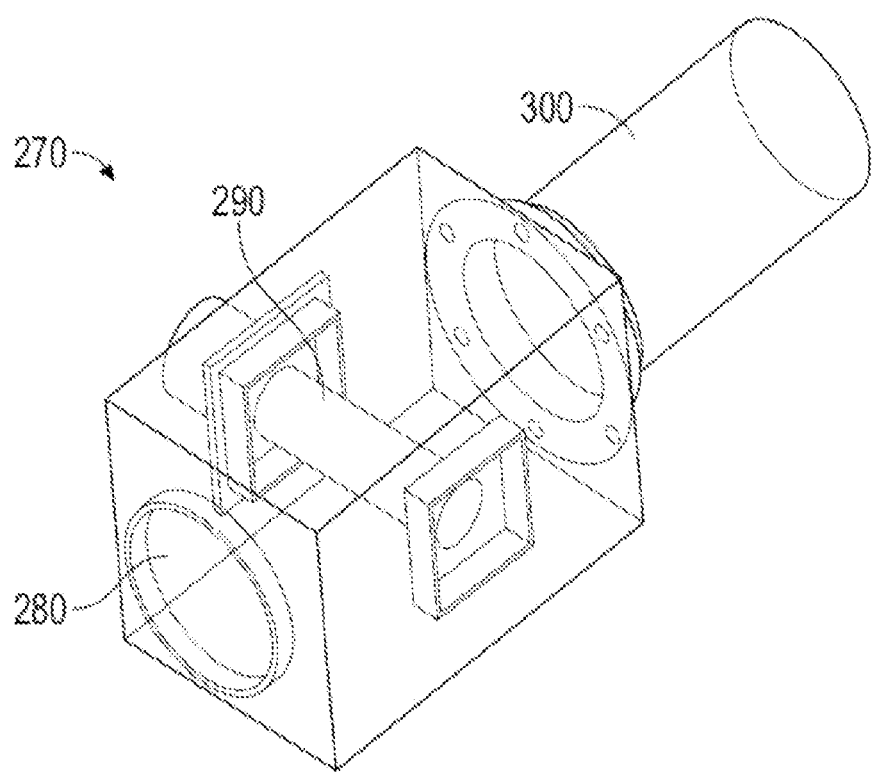
FIG. 19 is a solid model schematic of an end fitting for large scale spool-to-spool continuous production of NF I, NF II, and NF III as alternative designs of FIGS. 14 and 15.

An alternative design of the T-fittings of FIGS. 14 and 15 is shown in FIG. 19. Endcap assembly 270 of FIG. 19 for the CVD furnace is designed specifically for the continuous process growth of carbon nanotubes onto a moving flexible substrate. This assembly consists of a primary housing with weld-in gas fittings (not shown) and sealed access port 280, and is configured to receive motorized spool 290. Access port 280 provides access for maintenance or modification of the internal housing. Consumable silicone gaskets preferably rated to 475° F. are preferably used to seal the access port and to seal end cap assembly 270 to the end of furnace quartz tube 300. Spool 290 is a preferably modular element that can slide horizontally into the housing through access port 280 or from the side faces through one or both of the square openings shown in FIG. 19, which are then closed during operation, and is preferably secured with bolts. An external stepper motor (not shown) attached to the spool preferably provides the rotation required to draw the substrate material through the furnace. After processing, the spool can be removed easily without removing the endcap unit.

Figure 20:
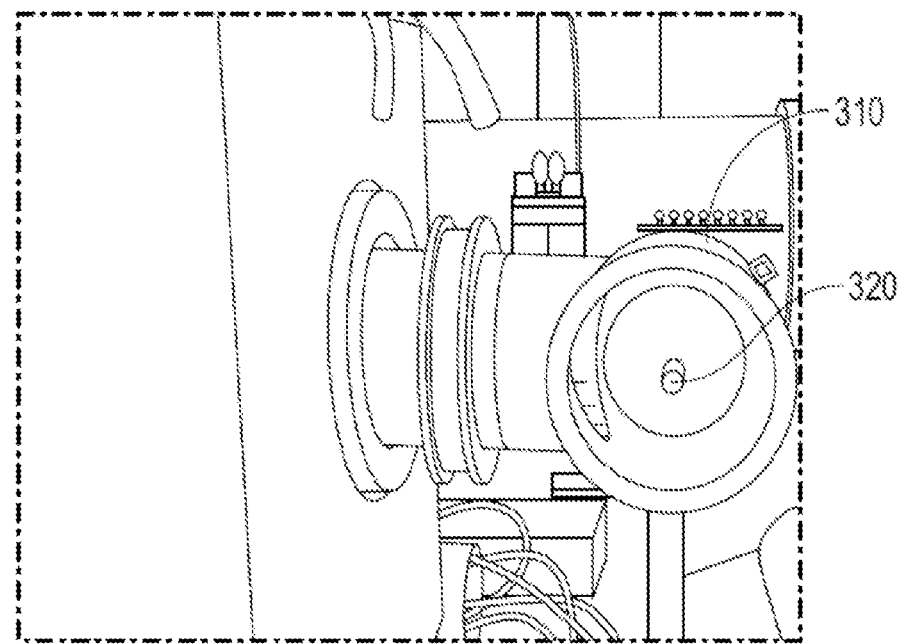
FIG. 20 is a photograph of the side of a 6" furnace system for continuous NF (NF I, NF II, and NF III) growth with the T-fitting in place in accordance with FIGS. 14 and 15.
Figure 23:
FIG. 23 is an SEM image showing uniform consistent NF thickness from point to point (i.e. top to bottom).

To demonstrate growth and production at a larger scale, a 6" continuous system was manufactured and assembled, similar to the 2" continuous design. FIG. 20 is a side view of the setup for the 6" continuous CVD system showing T-fitting 310 and spool 320. Uniform CNT growth on static/batch $SiO_2$ wafers was demonstrated using the system of FIG. 20. FIG. 21 shows CNT growth runs on 4" $SiO_2$ wafers in the 6" furnace. FIGS. 22A and 22B are SEM pictures of the wafers from the 6" furnace showing CNT growth similar to the 2" furnace. FIG. 23 shows consistent growth from point-to-point on a 4" wafer. To demonstrate the consistency and replication of the original results, Deployable Composite Boom (DCB) samples were manufactured and tested using Cycom 977-3 resin sheets (60.2 gsm) and AS4 plain weave carbon fabric (3 k, 200 GSM) according to ASTM D 5528-01. For the modified nanocomposites, CNTs grown on 4" $SiO_2$ wafers inside the 6" furnace were used. The original percentage improvement in fracture toughness values of DCB samples produced in the 2" furnace was 148%, while the percentage improvement of samples from the new 6" furnace was 145%.

Figure 24:
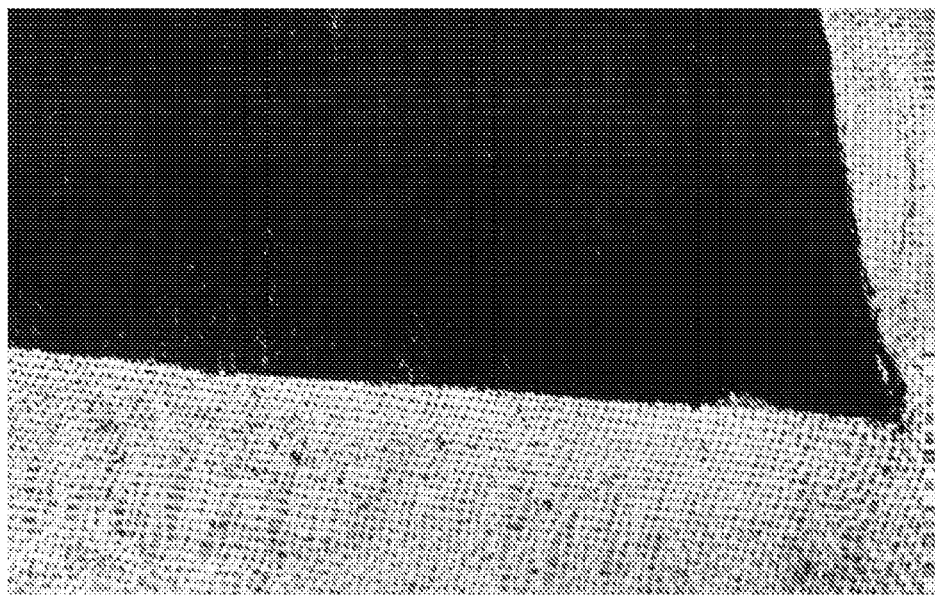
FIG. 24 is a photograph showing high quality NF II placed on a fiberglass fabric for a wet layup approach.
Figure 25:
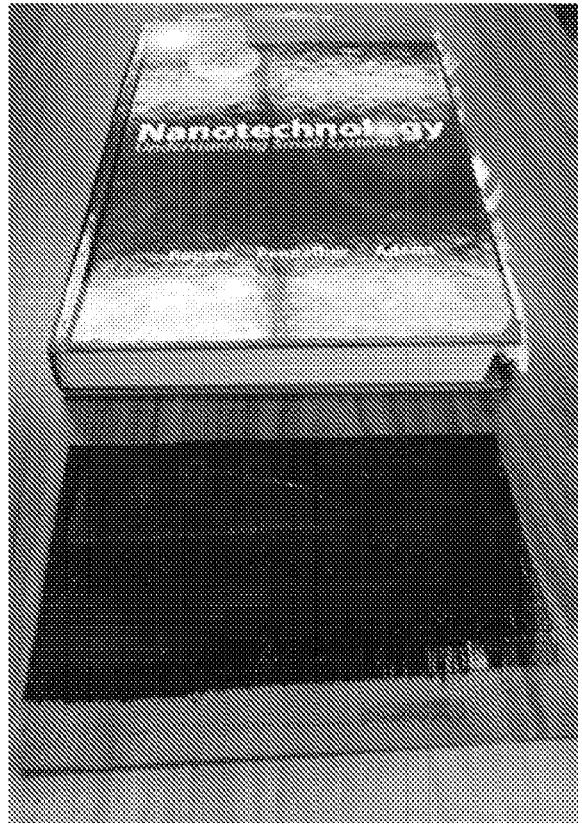
FIG. 25 is a photograph showing transfer of high quality NF II from a substrate on a prepreg system for a prepreg layup approach.
Figure 26:
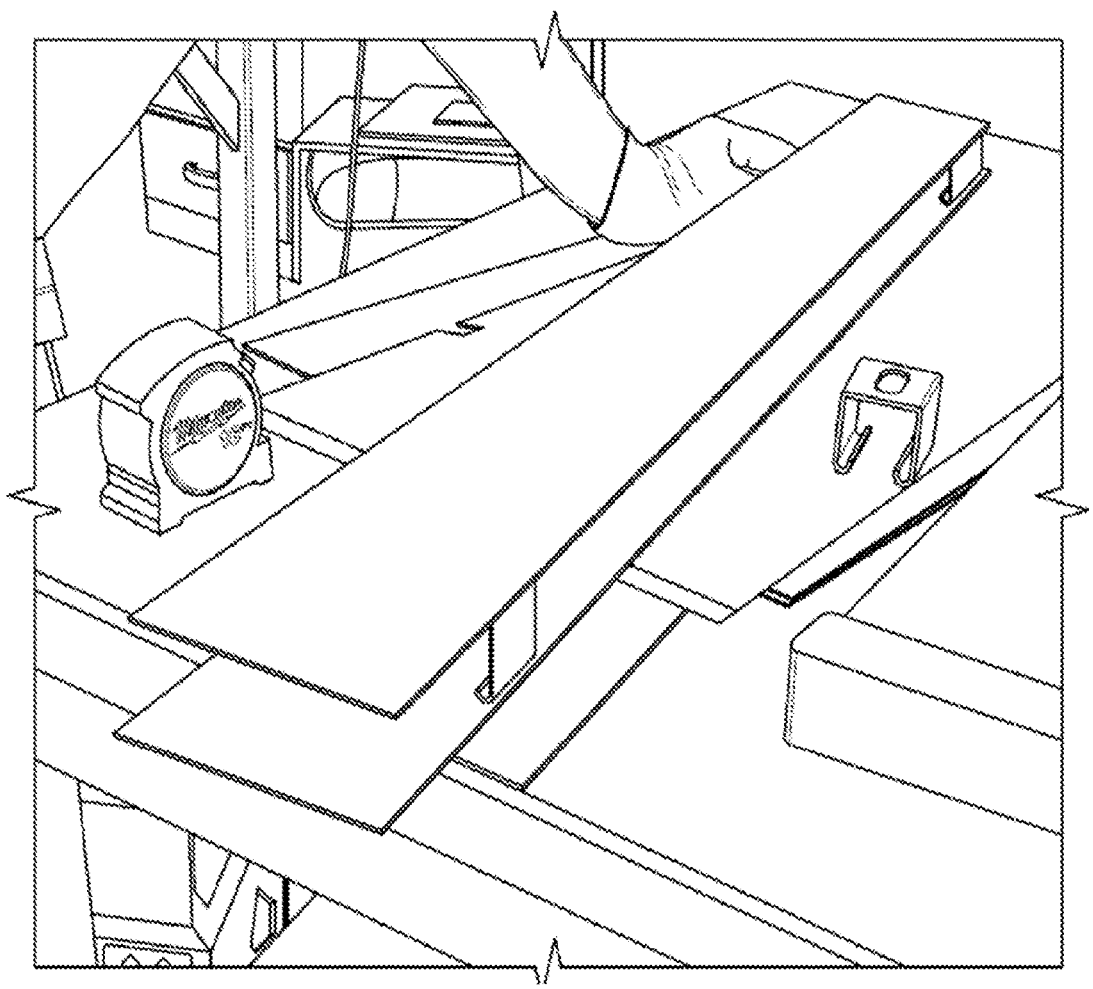
FIG. 26 is a drawing showing a double-decker substrate arrangement for rigid and flexible substrates suggesting that multiple-layer substrates with multiple spools, as shown in FIGS. 14 and 15, can be used to increase the large scale spool-to-spool continuous process production rate.

FIG. 24 shows a high quality NF II placed on a fiberglass fabric for a wet layup approach. FIG. 25 shows the transfer of a high-quality NF II from the substrate on a prepreg system for a prepreg layup approach; a textbook is shown for scale. FIG. 26 shows successful batch NF growth on a double-decker rigid substrate arrangement. This can be extended to simultaneous continuous NF growth on multiple flexible substrates during commercial spool-to-spool operation, where the substrates can extend between multiple pairs of rolls or spools that are vertically stacked, arranged side by side, or in any configuration. That is, NF can be synthesized on multiple substrates driven by multiple spools simultaneously instead of only a single substrate/spool system. It is also possible to run smaller-width substrates next to each other run by the same spools for each horizontal layer in addition to stacking the substrates on top of each other vertically.

In a similar manner, NF1 can be produced using large scale spool-to-spool production, except that for NF II the substrate is preferably a flexible thin metal on which NF II can be grown and the NF II grown substrate can be spooled with a continuous thin separating paper/film/sheet in between the substrate/NFII layers. In addition, for the NF II, as mentioned earlier, a small amount of water vapor is used during the CVD process, such that the NF II can be separated from the substrate, leaving the catalyst particles on the substrate. However, for NF I, the substrate is preferably first coated with a very thin layer of preceramic polymer, which is then cured and pyrolyzed, and then the coated fibers preferably go through the same spool-to-spool continuous process. A continuous thin separating paper/film/sheet in between the substrate/NF I layers should be used, similar to NF II. Also, preferably no water vapor is used during the CVD processing of NF I to ensure strong bonds between the fiber substrate and the NF I.

One embodiment of the process of the present invention comprises the following steps:
 1. Start furnace;
 2. Vacuum—sweep/purge;
 3. Set argon flow rate to equilibrium;
 4. Set oven temperature and hold until about 750° C.;
 5. Preheat shower feed lines to 200° C.;
 6. Optimize feed injection rate;
 7. Maintain the substrate for about 5-10 minutes in hot zone growth to achieve about 10-20 microns growth (which is an optimum length/thickness for prepreg use);
 8. Move web/substrates through to cool zone; and
 9. Take up finished material with a release liner.

Figure 27:
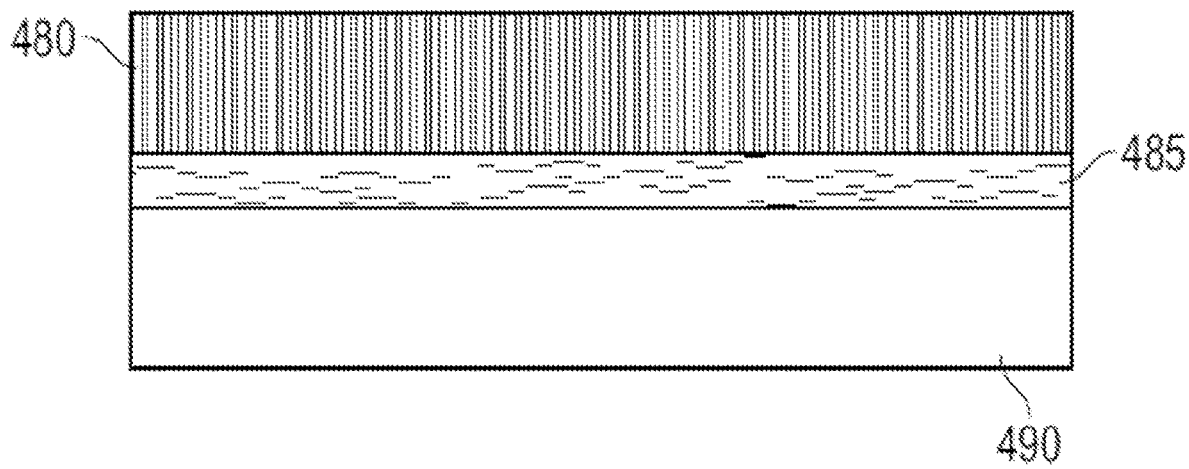
FIG. 27 is a schematic of the NF III technology, where a vertically aligned CNT Nanoforest VA-CNT-NF is grown or placed on top of a HA-CNT-NF to provide orthogonal properties improvements. Alternatively the VA-CNT-NF can be below and the HA-CNT-NF can be on top. Either NF may deviate from being fully horizontally aligned or fully vertically aligned; i.e., they may be at some angles other than 90° with respect to each other.

Orthogonal nanoforests, also known as Nanoforest III (NF III), have been batch manufactured. In the embodiment shown in FIG. 27, Vertically Aligned Carbon Nanotube Nanoforest (VA-CNT-NF) 480 is grown on Horizontally Aligned Carbon Nanotube Nanoforest (HA-CNT-NF) 485, which is on substrate, fiber, or fabric 490. This "3D Orthogonal Nano-Tape" technology can be incorporated into a prepreg (or a wet lay-up) composite to provide orthogonal property improvements. In some embodiments one can start with HA-CNT-NF nano-tape (which can be produced from NF II or even NF I) first, and then, instead of growing a VA-CNT-NF onto it directly (either on a fiber/fabric or on a substrate), a VA-CNT-NF is grown separately on a substrate, removed from the substrate, and placed onto the HA-CNT-NF which is either on a fiber/fabric or on the substrate. Alternatively, instead of having HA-CNT-NF at the bottom and VA-CNT-NF on top, as shown in FIG. 27, one can create the opposite configuration in which the VA-CNT-NF is at the bottom and HA-CNT-NF is on top. The alignment of the HA-CNT-NF and the VA-CNT-NF within the NF III may deviate from being fully horizontally aligned and/or fully vertically aligned; that is, they may be at a relative angle other than 90-degrees with respect to each other, which may be desirable for some specific applications. Although the NF III shown schematically in FIG. 27 as [HA-CNT-NF, VA-CNT-NF]n, where n=1, this n can be 1, 2, 3, and so on. Or the NF III can be [VA-CNT-NF, HA-CNT-NF]n, where n=1, 2, 3, and so on. This approach can be used for any type of carbon nanotube (i.e., SWCNTs, DWCNTs, or MWCNTs), any nanotube material, (e.g., Zn-ONT, and BN-ONT, and others), or any nanowire (such as Si-ONW, CuO-ONW, ZnO-ONW), where here "ONT" stands for "Orthogonal Nano-Tube" and "ONW' stand for "Orthogonal Nano-Wire". The sequences of the HA-CNT-NF (HA) and VA-CNT-NF (VA) in NF III can be alternating and/or repeating, such as HA/VA/HA/VA/etc., VA/HA/VA/HA/etc., HA/HA/VA/VA/etc., or VA/VA/HA/HA/etc.

In one experiment, the transfer of NF III onto a T650-35/RM-1100 prepreg system in a DCB Mode I Fracture Toughness Test produced a GIC which was 27% better for the prepreg with NF III compared to its counterpart without NF III. An 11% improvement was achieved using the same test for a T650-35/AFR-PE-4 system with NF I, in which CNT-NF I were grown on a T300 Carbon Fabric and then impregnated with AFR-PE-4 to make the prepreg system. A more detailed description of NFIII, its use as a reinforcement, and its batch manufacture may be found in International Patent Application No. PCT/US2021/015588, incorporated herein by reference.

For the large scale spool-to-spool production of NF III, one can employ the large scale spool-to-spool production of either NF II or NF I, and then the sample can be converted to NF III. NF 1 or NF II produced in the large scale spool-to-spool process taken from the end take-up spool of the substrate can be employed as the starting material. After exiting the furnace, the NF I or NF II, together with the separating sheet, are preferably passed through rollers to collapse the VA-CNT-NF into a HA-CNT-NF. Subsequently, the take-up spool of the HA-CNT-NF (after removal of the separating paper/film/sheet) is preferably used as the starting spool and undergoes the large scale spool-to-spool production of NF 1 or NF II (i.e., VA-CNT-NF) growth on the HA-CNT-NF, resulting in the large scale spool-to-spool production of NF III.

Figure 28A:
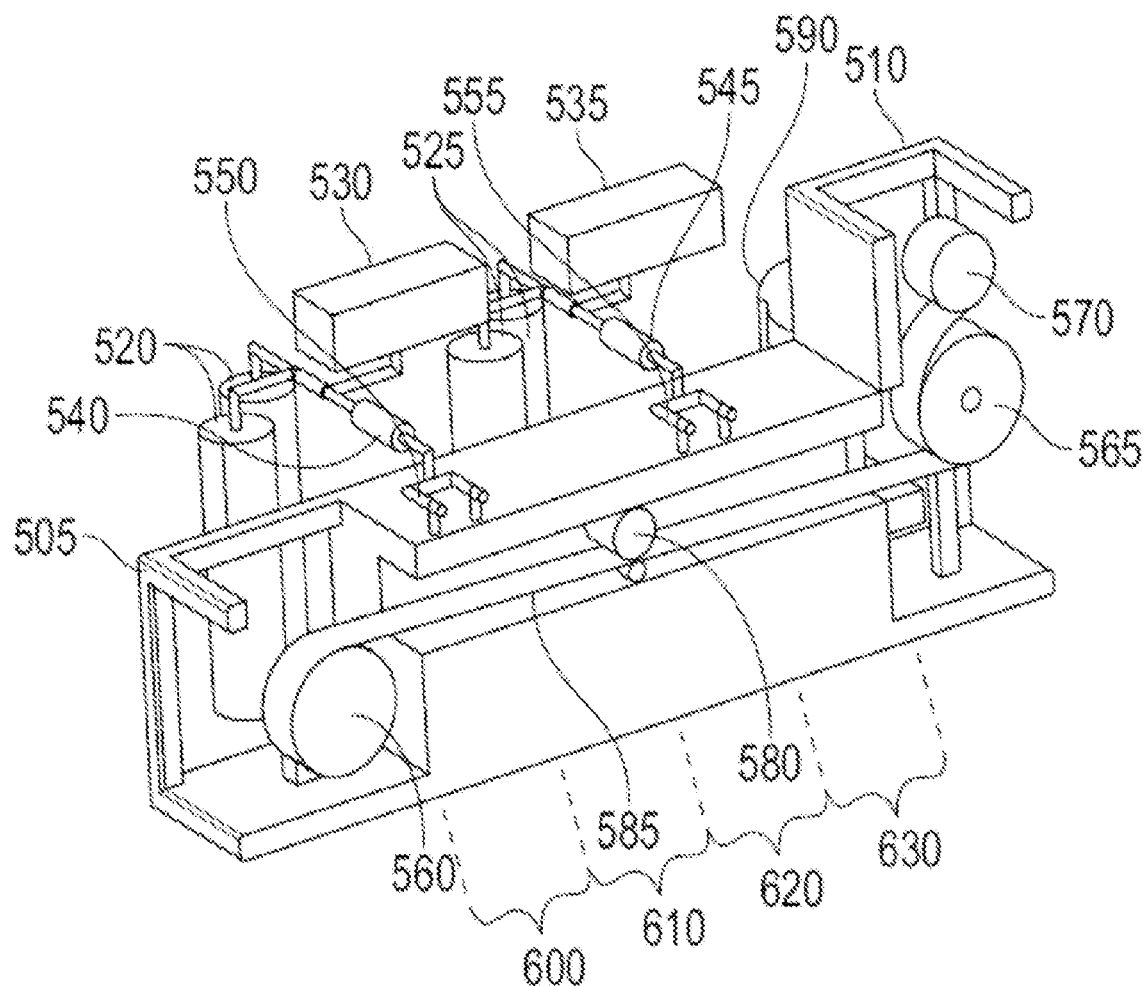
FIGS. 28A-28C show a cut-away front view, solid model front view, and solid model rear view, respectively, of large scale continuous CVD furnace systems utilizing roll-to-roll processing.
Figure 28B:
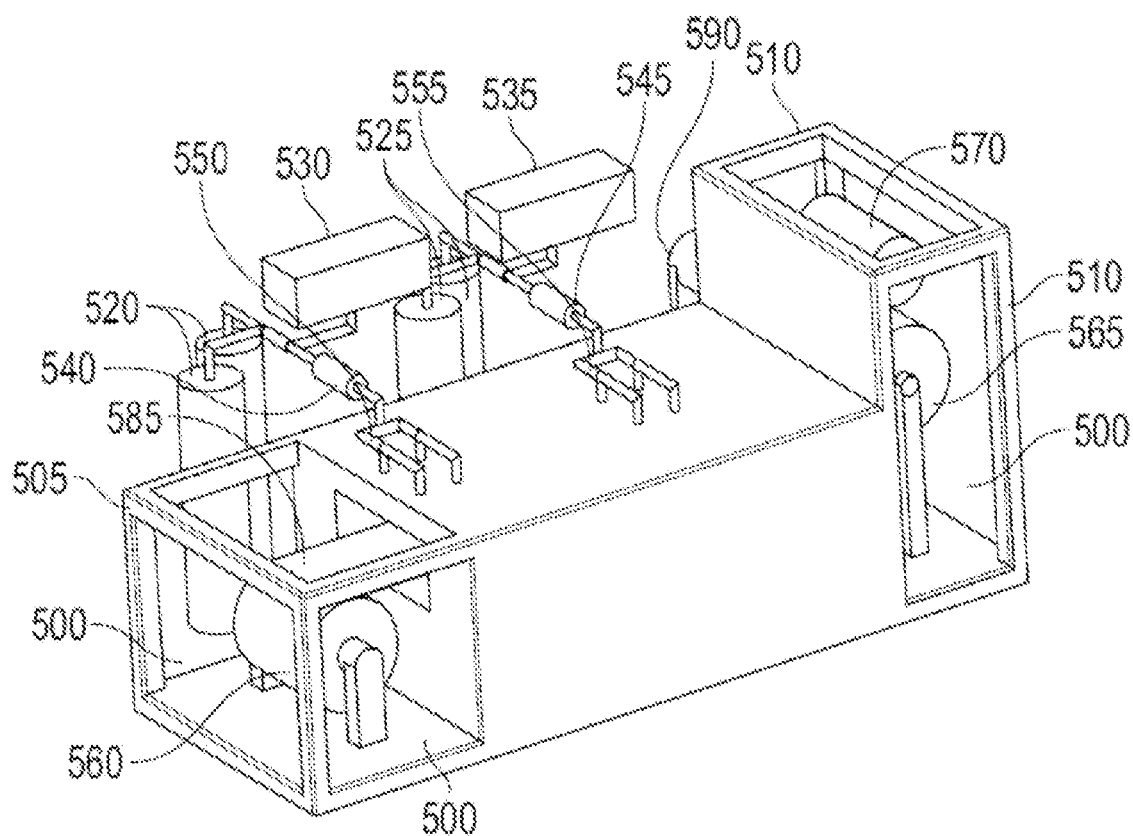
Figure 28C:
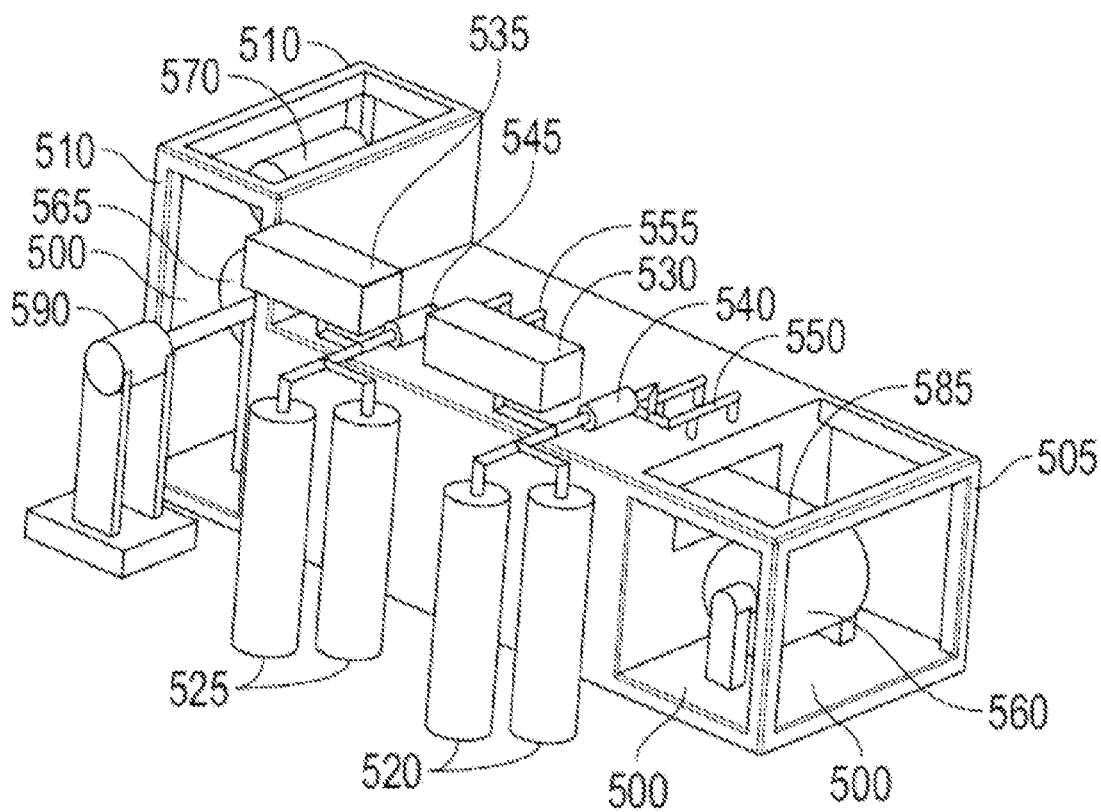

An example two-stage system of the present invention is shown in FIGS. 28A-28C. The system is preferably capable of manufacturing continuous roll-to-roll nanoforests of various kinds, for example NF I, direct growth on fibers/fabrics, and NF II, growth on substrates; however, the system shown is a two stage system configured to produce NF III. This system will use an automated control system described in more detail below, and it will preferably be a closed system for the safety of the operators. The system preferably comprises transparent material 500, for example plexiglass, enclosing roll housings 505, 510; stage 1 argon and hydrogen cylinders 520, stage 2 argon and hydrogen cylinders 525, stage 1 precursor supply 530, stage 2 precursor supply 535, stage 1 preheater 540, stage 2 preheater 545, one or more stage 1 injection showerheads 550, one or more stage 2 injection showerheads 555, feed roll 560, take-up roll 565, separator roll 570 (for holding a material such as Kapton that interleaves with the nanoforest/substrate layers to keep them separated as they are taken up by the take-up roll), flattening rollers 580, and one or more stepper motors 590 for turning the rolls and rollers based on the control system shown in FIG. 29. Feed roll 560 is preferably connected to a tensioner system to maintain tension in the flexible substrate, while take0up roll 565 is preferably connected to stepper motor 590. In this system a VA-CNT-NF is grown on substrate 585 in stage 1 growth zone 600, cooled in stage 1 cooling zone 610, flattened by flattening rollers 580 (in some embodiments similar to a rolling mill) into a horizontal nanoforest or HA-CNT-NF, as described above. Then another VA-CNT-FN is grown on the HA-CNT-NF in stage 2 growth zone 620, cooled in stage 2 cooling zone 630, and the resulting NF III is taken up by take-up roll 565 after it exits the furnace. The rolls and substrate can be of any width; they are narrower in FIG. 28A than in FIGS. 28B and 28C. The rolls will preferably accept any type of substrate roll, such as dry fiber roll, dry fabric rolls, prepreg rolls, and Kapton film rolls. The typical laboratory dimension of the system shown in FIGS. 28A-28C is about 6 feet in length, about 30 inches in width, and about 30 inches in height, which can accommodate a substrate width of about 12 inches. However, these dimensions can be scaled up or scaled down with same or different, linear or non-linear, proportions for no-loss-of-generality, depending on the needs of the materials and systems.

The continuous process of the present invention preferably has the following features:
  100% enclosed chamber;
  Roll-to-Roll (Spool-to-Spool);
  Use of Multiple Shower Heads for CVD;
  Release/Separating films/sheets/papers;
  Gas Flow Controllers with Regulators;
  Liquid Flow Controllers with Regulators;
  Injection Systems;
  Shower Heads;
  Preheaters and Controller Systems;
  Heating Elements and Insulating Fire Bricks;
  Motor and Controller System;
  Sensors and Actuators;
  Rollers;
  Argon and Hydrogen Cylinders (or optionally another gas such as acetylene);
  Needed Accessories;
  Growing on web(s) and multiple layers;
  Plasma/CVD for site specific heating;
  Growing on all thin and flexible metals for NF II and NF III;
  Growing on all fibers (with and without thin preceramic coating) for NF I and NF III;
  NF II (and NF III) for Prepregging and Wet Lay-up;
  NF I (and NF III) for Wet Lay-up; and
  Large Core Spools (beyond minimum bend-radius) to avoid substrate and nanoforest damage while rolling.

The system is preferably closed, unlike the open systems currently being used in the industry for such continuous processes. The closed system enables continuous roll-to-roll (spool-to-spool) manufacturing while providing a safer and more controlled environment inside the furnace. It also provides a safer operation for workers as reels, raw and processed material(s), and the furnace are all fully enclosed, reducing escape of gases, fumes, heat, nanomaterials and/or base material fragments and minimizing any potential fumes and nanomaterials inhalation. Leakage of nanomaterials, chemicals, gasses, and process by-products into the work environment, and therefore exposure of workers, is minimized or eliminated. An enclosed system limits any accidental malfunctions within the system and protects the workers and environment, providing safe operation. A closed system enables incorporation of multiple shower heads and multiple supply/take-up spools which are advantageous in terms of cost of operation, labor, and material supplies while increasing the throughput. Typical prior continuous systems for CNT growth in industry incorporate existing open furnace designs.

The system of the present invention may use one or more of the following components or characteristics:

Shower heads—multiple heads, variable flow rates, balanced process, distance from webs/substrates, etc. Use of an atomizer with showerhead capable of spraying the CNT precursor solution onto the substrate for growth of CNTs. When multiple showerheads with atomizers are used (with rows and columns inside the furnace) in conjunction, the CNT growth area and throughput can be increased accordingly and substantially. The showerheads are preferably capable of moving in any direction through servo controlled motors based on feedback from in-situ growth monitoring QC techniques in accordance with FIG. 29.

Laser for in-situ thickness measurement (NFs length/thickness is preferably optimized, particularly for prepreg systems).

Feedback loop control—speed, flow rate, temperatures, multiple loops, "air knife" to lock in gasses in particular regions of enclosed system.

One- or two-sided NF growth—vertical web and/or horizontal shower heads.

Airlock to get raw materials in and finished goods out of full enclosure without a purge of the system to allow continuous processing, vs. "batch & purge". The airlock allows material to be moved into/out of the enclosure without contaminating the system or allowing gasses to exit. An airlock comprising a material loading or unloading compartment with an outside door to insert raw material or remove finished material preferably comprises a sealed isolated zone that can be safely purged of outside air and replaced with controlled atmosphere, after which the inner door is opened allowing material in or out, preferably such that no two doors are opened at the same time. An automated roll-to-roll (spool-to-spool) transfer station located at the let-off and wind-up ends of the production line (see FIGS. 14 and 15) provides for continuous operation without interruption and a means for loading raw materials and unloading of finished goods. The transfer station may be a multi roll turret with automatic web splicing and roll transfer functions typically used in roll processing that are located within the enclosure or airlock and additionally provides a mechanized means for raw and finished product to be transferred within and outside of the enclosed system. With automatic roll splicing, when the running roll is depleted, the machine automatically joins the end of the expiring web, i.e. substrate, roll to the leading edge of the new substrate roll.

Multifunctionality: The CVD furnace will preferably be capable of multifunctionality, i.e., multiple functions could be performed at a time in one single zone. For example, a single zone may be capable of performing multiple functions in a sequence such as CNT growth, means for separation, rolling CNTs, etc. A single zone with multiple functions compared to multiple zones for every function (1) saves furnace space in addition to cost benefits, (2) increases flexibility and capability of the machine, and (3) reduces processing time as well as increased complexity of passing the substrate through a multiple zone system.

Enclosure: The enclosure is naturally suited to protect the equipment inside and personnel and facilities outside from hazards, thereby providing operation security. Active sensors and instrumentation may be used to keep the process safe (and for product quality control) by automatically triggering alerts and/or safe process shutdown if something goes wrong. Such sensors may include, but are not limited to, pressure, temperature, and gas detectors for gases including oxygen, hydrogen, toxics, etc. The enclosure can be electrically grounded to reduce personnel shock hazard and constructed in such a way that moving process material (e.g., webs/substrates) does not build up a static charge since it may be electrically attracted to or repelled from parts of the processing equipment such as "shower heads" or other equipment. The enclosure is naturally suited to reduce risk of fire or explosion by balancing pressure, preventing air (oxygen) ingress and, in the case of fire or explosion, to reduce hazards to personnel or the building in which it is contained and housed, by containing an explosion with appropriate safety precautions and measures. This protection may be enhanced by the use of a pressure-relief valve(s) on the enclosure. A full enclosure is naturally secure preventing tampering, damage, vandalism or theft of equipment. The enclosure may be made more secure by locks or other securing devices on access ports, end caps, airlocks, and/or doors. A full enclosure allows higher quality, cleaner, more uniform and/or purer processed material due to controlled atmosphere throughout the enclosed system allowing the raw material to purge itself of air and humidity (i.e. degas) and fully absorb the controlled atmosphere.

Material: Sheets (for NF II and NF III based on NF II) vs Fibers (for NF I and NF III based on NF I)—Sheets, belts, foils, fibers, and any material upon which CNTs can be grown may be similarly processed on the same equipment. The materials are preferably capable of rolling onto a spool for feeding into and out of the furnace.

Process flexibility: Multiple substrates may be made to run alternatively (and/or in parallel in both vertical and horizontal configurations) or sequentially (and/or in series) on the same machine. The machine may be programmed to automatically run different material and/or different processes in parallel or in sequence by changing process parameters including materials feed rate, feed locations, gas flow, temperature, processing speed, processing time, amount of growth, and "runs" between "runs". As-grown CNTs NF I (and/or NF III based on NF I) on fiber architectures in the CVD furnace can automatically be passed onto a cool-off zone. After the necessary temperature is achieved in the cooling zone, an in-line transfer can be made to transfer a resin film/paper/sheet onto the fiber architecture with NF I (and/or NF III based on NF I) using in-situ IR heaters and rollers. The fiber architecture can be of any weave/harness and of any fiber material. The material coming out is recipe driven which can be just fiber architecture with NF I (and/or NF III based on NF I) on it. Alternatively, as-grown CNTs NF II (and/or NF III based on NF II) on foils/tapes in the CVD furnace can be passed onto a cool-off zone. Once the tape reaches ambient temperature, an in-line transfer of a resin film/paper/sheet or just a collecting (Teflon) film can be made onto the tape with NF II (and/or NF III based on NF II) on it using in-situ IR heaters and pressure using rollers. This process is independent of the foil material. The NF II (and/or NF III based on NF II) material coming out of the furnace is recipe driven, which can be plain NF II (and/or NF III based on NF II) in between Teflon films or a prepreg with NF II film (and/or NF III based on NF II) embedded in it. The system will preferably be suitable and viable for large-scale (e.g., up to 54" wide×500 yard rolls) continuous production on flexible metallic foil roll-to-roll. While NF I requires some surface treatment, NF II requires no surface treatment and can be used on a variety of fibers, for example glass, carbon, or Kevlar, for wet lay-up or prepreg. NF II (and its NF III) is an excellent technology for local applications (e.g., lightning strike resistance, EMI shielding, thermal and electrical conductors, and composite joint areas such as adhesive and bolted joints).

Quality/Process Control: Continuous on-line in-situ monitoring of the growth process, for example using lasers to monitor and control growth, thickness, and quality, or other in-line thickness measurement tools, can be used. A continuous in-line, real-time thickness or density measurement system that may scan the web on the substrate in the cross web direction (fabric, fiber, tape/substrate) or have multiple fixed gages located across measuring lanes, and calculate the net CNT growth with two gage systems; for example, a gross thickness (fabric/substrate 30 CNT growth) minus basis thickness (fabric/substrate only), can be used. The thickness or density gage may employ lasers, ionizing radiation, or other non-contact, non-destructive means in combination with a computer based data acquisition and control system to display CNT growth thickness or density. This results in improved product uniformity and quality, and less scrap.

Figure 29:
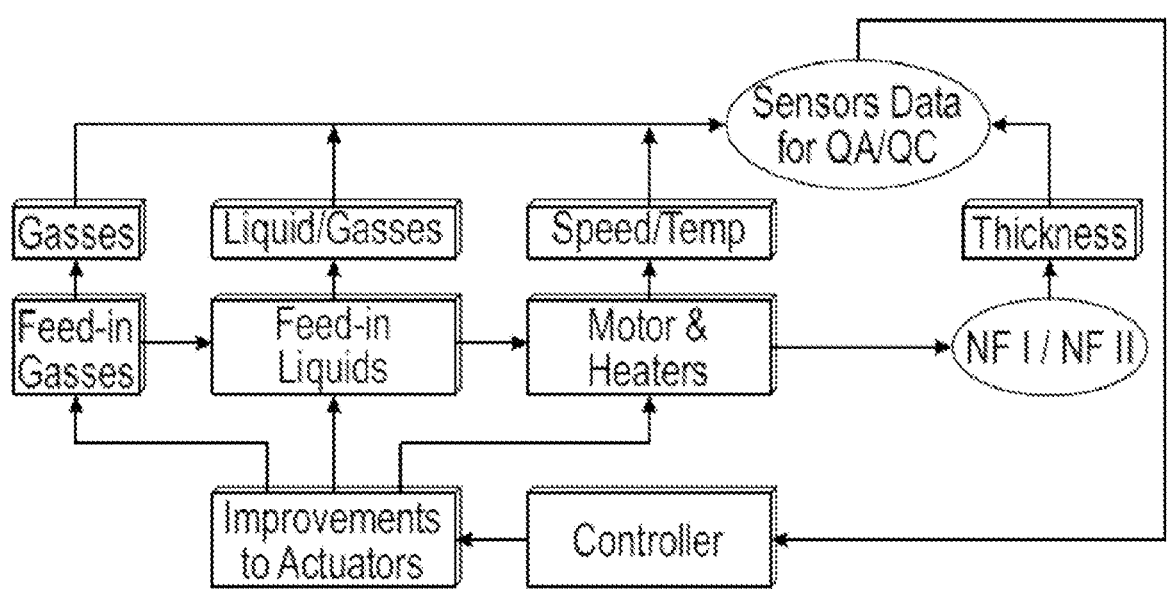
FIG. 29 is a schematic showing an embodiment of the Smart/intelligent Magic Box Additive (SIMBA) system of the present invention for the continuous production of NF I and NFII (and their corresponding NF IIIs, or any combinations thereof).

Embodiments of the Smart/Intelligent "Magic Box" Additive (SIMBA) system of the present invention preferably comprise a closed loop feedback control system which feeds the calculated net CNT growth thickness or density from the thickness or other parameter measurement into a recipe-based computer control system. The recipe-based software sets the key process parameters including mass flow rate of gasses, line speed, temperatures, time, and other key parameters. The recipe controls the system setup and startup and these process-running parameters are stored in the software recipes. The feedback from the thickness measurement system provides an input that enables the recipe-based system to provide a corrective output response, resulting in higher throughput, more uniform quality, and less labor. As shown in FIG. 29, the SIMBA system may comprise one or more of the following subsystems.

Sensors will preferably sense/measure the process condition for Quality Assurance (QA)/Quality Control (QC). If the process conditions are improper then these sensor signals will provide a feedback signal to correct the problems. These sensors are shown in FIG. 29, where four main sensors are identified (it should be noted that each of the four sensors of FIG. 29 are composed of one or more sensors to fully sense the needed parameters). In FIG. 29, from left to right, the sensors are (1) gas sensors that sense/measure the conditions of the inert and other carrier gasses; (2) Liquid/Gasses sensors comprising two sensor sets. The first set senses/measures the conditions (e.g., flow rate, liquid ratio, gas ratio, temperature, etc.) of the feed-in injected liquid mixture. The second set senses/measures the conditions (e.g., species ratio of the gasses, etc.) of the carbon source and catalyst gasses produced in the furnace from the injected liquid mixture; (3) Speed/Temperature sensors comprising two sensor sets. The first set senses/measures the speed of the tape/substrate. The second set senses/measures the furnace temperature at various locations; (4) Thickness sensors that can measure a) the rate of the thickness growth, and b) the final thickness of the nanoforests (i.e., NF I, NF II, and their NF III); and (5) other sensors (including other types that are not described here but which are compatible with the SIMBA system of the present invention). Data are sent to a "Sensor Data for QA/QC" hub to be sent to the controller as the feedback signals.

As shown in FIG. 29, all sensor data are sent to the Controller for processing, which preferably sends signals to the Improvements to Actuators hub to send signals to the appropriate actuators to correct the problems sensed by the sensors based on the decision of the controller to correct the sensed problem(s). The controller will be set up based on the optimum empirical process data developed for such process, where the optimum empirical rules function as optimum recipe.

Actuators take corrective actions based on the signals they receive from the Controller and the Improvement to Actuators hub to correct the problems sensed by the sensors (Gasses, Liquid/Gasses, Speed/Temp, and Thickness). These actuators are shown in FIG. 29, where three main actuators (Feed-in Gasses, Feed-in Liquids, and Motor & Heaters) are identified (each actuator may comprise one or more actuators to fully correct the detected problems/parameters). In FIG. 29, from left to right, the actuators are (1) Feed-in gas actuators to control the condition (e.g., flow, temp, ratio, etc.) of the inert and other carrier gasses; (2) Feed-in liquid/gas actuators comprising two actuators sets. The first set controls the conditions (e.g., flow rate, liquid ratio, temp, etc.) of the feed-in injected liquid mixture. The second set controls the conditions of the carrier gasses; (3) Motor/heater Actuators, comprising two actuators sets. The first set controls the speed of the motors/tape, which thereby control the rate of the growth and the final thickness of the NFs. The second set controls the furnace temperature at various locations. Other continuous processes such as prior coating of the substrate prior to the growth of NF I (and/or its NF III) may require additional sensors and actuators.

New material processing may be semi-automated by utilizing a sensor-based, computer-controlled active feedback control system in which a desired parameter (e.g., growth thickness) is specified and the various parameters such as gas flow rate, material transport rate, chamber temperature, etc. are automatically optimized through the controller's signals to the actuators.

The enclosure may comprise quartz viewing ports allowing observation of processes for scientific or quality control purposes in a manner better than isolated reaction zones. Specialized viewports allow external instrumentation such as spectrometers (e.g., Raman, IR, and/or UV-Vis) to be utilized during the process for QA, learning, or process control reasons. For example, a Raman system can be used to characterize the quality of CNTs being grown in-situ. Based on the information collected, a feedback system can modify mass flow control of gases, precursor injection rates, and temperature in growth zone to control the quality of the CNTs being grown.

For NF I (and/or its NF III) a single-step coating process is preferably used irrespective of the fiber or tape used. In this process, a CVD SiOC or polymer SiOC coating (i.e., a preceramic polymer) is applied to initiate seeding of catalyst particles into the coating for CNT growth using the liquid injection technique. This process is efficient when compared to existing techniques, which involves the substrate going through multiple steps before being fed into the CVD furnace.

Multiple reels/spools of raw and take-up reels/spools of processed materials may be housed within the enclosure permitting parallel "bulk processing" of materials, in both horizontal and vertical configurations, to be faster and therefore more economical. The multiple reels/spools may hold different materials. For example, one roll and/or spool of carbon fiber, one roll and/or spool of copper foil, and one roll and/or spool of silicon carbide fabric can be run through, simultaneously in the same furnace.

Potentially faster processing speed is enabled as raw material is pre-purged of air and humidity and permeated within the controlled atmosphere before it enters the processing zone(s), thus not needing "soak time" prior to entering a reaction zone.

Operation is safer for workers as reels and/or spools, raw and processed material(s) and furnace are fully enclosed reducing escape of gases, fumes, heat, nanomaterials and/or base material fragments that could be inhaled.

Processes are highly flexible since the full enclosure can be heated or cooled, pressurized or evacuated, and/or filled with gases, fumes, or vapors to suit the process.

A full enclosure system can be made portable and/or easily shippable/transportable as all delicate equipment is enclosed.

Multiple processes in multiple reaction zones can be performed in sequence without substrate material exiting the controlled atmosphere enclosure. This may allow complex multi-stage processes to be accomplished in one sequential or parallel process inside the enclosure.

The footprint can be reduced by "stacking" multiple reaction zones vertically and using roller-guides to move the material in a "Z-fold" manner to pass material from one zone to the next inside the controlled atmosphere enclosure, resulting in a very efficient footprint.

Faster material processing speed and a higher production rate can be achieved by passing the material through numerous (X) sequential reaction zones stacked one-above another, connected by reels inside the enclosure enabling the material to make a U-turn at the end of each zone then back into the next (above, below or to the side). The total processing length of the combined reaction zones is thereby a multiple (X) of a single zone. Thus, an equivalent material reaction time (T) can be achieved at X times the processing speed of a single processing zone without exiting the controlled atmosphere enclosure thereby reducing the cost of processing and increasing the throughput capacity of the processing unit.

Modularity: A full enclosure may be modularly constructed allowing great flexibility of process and configuration by allowing attaching or detaching of different material processing units containing reels/spools of different sizes or kinds and configuration of the processing types and sequences within one or more processing zones inside the enclosure. Similarly, and in addition, the enclosures may be connected together in sequence to create great process flexibility or increase the scale and/or speed of the processing.

Atmospheric Quality: A fully enclosed system can be made to vent, purge, or inject controlled atmospheres (or gases) in a controlled manner during, before, or after processing to create flexibility of process and ensure the atmospheric quality is maintained or properly changed per process requirements.

Umbrella Hood: A fully enclosed system may enclose individual processing zones that use several different processing zones each with its own controlled atmosphere within the enclosure which can act as an "Umbrella Hood" to safely purge controlled atmospheres and to prevent mixing of such atmospheres between the processing zones.

Note that in the specification and claims, "about" or "approximately" means within twenty percent (20%) of the numerical amount cited. As used herein, the singular forms "a," "an," and "the" include plural referents unless the context clearly dictates otherwise. Thus, for example, reference to "a functional group" refers to one or more functional groups, and reference to "the method" includes reference to equivalent steps and methods that would be understood and appreciated by those skilled in the art, and so forth.

Although the invention has been described in detail with particular reference to the disclosed embodiments, other embodiments can achieve the same results. Variations and modifications of the present invention will be obvious to those skilled in the art and it is intended to cover all such modifications and equivalents. The entire disclosures of all patents and publications cited above are hereby incorporated by reference.

What is claimed is:

1. A method for continuous production of nanoforests, the method comprising:
    unrolling a flexible substrate from a feed roll into a first furnace;
    growing a first nanoforest comprising first nanotubes or first nanowires on a surface of the substrate as it passes through a first growth zone in the first furnace, wherein the first nanotubes or first nanowires are oriented substantially perpendicular to the surface of the substrate;
    cooling the first nanoforest in a first cooling zone;
    rolling the first nanoforest through rollers to form a collapsed layer comprising the first nanotubes or first nanowires, wherein in the collapsed layer the first nanotubes or first nanowires are oriented substantially parallel to the surface of the substrate;
    growing a second nanoforest comprising second nanotubes or second nanowires on the collapsed layer as it passes through a second growth zone, the second nanotubes or second nanowires oriented substantially perpendicular to the surface of the substrate;
    cooling the second nanoforest in a second cooling zone; and
    rolling the substrate comprising the first nanoforest and the second nanoforest onto a first take-up roll.

2. The method of claim 1 wherein the first nanotubes or first nanowires comprise carbon, BN, Si, CuO, or ZnO.

3. The method of claim 1 comprising maintaining tension on the flexible substrate.

4. The method of claim 1 performed simultaneously on multiple parallel substrates.

5. The method of claim 4 wherein the multiple parallel substrates are arranged vertically or horizontally relative to each other.

6. The method of claim 1 further comprising, between the step of cooling the first nanoforest and the step of rolling the first nanoforest through rollers:
   rolling the substrate comprising the first nanoforest onto a second take-up roll; and
   unrolling the substrate comprising the first nanoforest from the second take-up roll.

7. The method of claim 6 wherein the second growth zone is located in a second furnace.

8. The method of claim 6 further comprising:
   inserting a first separator between adjacent layers of the substrate comprising the first nanoforest during the step of rolling the substrate comprising the first nanoforest onto a second take-up roll;
   removing the first separator during the step of unrolling the substrate comprising the first nanoforest from the second take-up roll; and
   inserting a second separator between adjacent layers of the substrate comprising the first nanoforest and the second nanoforest during the step of rolling the substrate comprising the first nanoforest and the second nanoforest onto a first take-up roll.

9. The method of claim 8 wherein the first separator and/or the second separator comprises a polyimide film.

10. The method of claim 8 further comprising, when the first furnace is enclosed during operation and the second take-up roll is full:
    closing an airlock between an enclosure housing the second take-up roll and the first furnace;
    unloading the second take-up roll;
    loading a new empty take-up roll in place of the second take-up roll;
    purging the enclosure; and
    opening the airlock.

11. The method of claim 1 comprising controlling one or more parameters selected from the group consisting of unrolling speed, rolling speed, substrate tension, precursor flow rate, carrier gas flow rate, furnace temperature, and preheater temperature.

12. The method of claim 1 comprising measuring a thickness of the first nanoforest and/or the second nanoforest during the growing step.

13. The method of claim 1 wherein the first furnace is enclosed during operation.

14. The method of claim 13 further comprising, when the feed roll runs out of substrate:
    closing an airlock between an enclosure housing the feed roll and the first furnace;
    loading a new feed roll;
    splicing the substrate on the feed roll and the substrate on the new feed roll;
    purging the enclosure; and
    opening the airlock.

15. The method of claim 13 further comprising, when the first take-up roll is full:
    closing an airlock between an enclosure housing the first take-up roll and the first furnace;
    unloading the first take-up roll;
    loading a new empty take-up roll in place of the first take-up roll;
    purging the enclosure; and
    opening the airlock.

16. The method of claim 1 wherein the substrate comprises fibers, a fabric, or a flexible metal.

17. The method of claim 1 wherein the step of growing the first nanoforest and/or the step of growing the second nanoforest comprises growing the nanoforest on both sides of the substrate.

18. The method of claim 1 further comprising separating the second nanoforest and the collapsed layer from the substrate after the step of cooling the second nanoforest.

19. The method of claim 1 wherein the second growth zone is located in the first furnace.

* * * * *